US011637177B2

(12) United States Patent
Li et al.

(10) Patent No.: US 11,637,177 B2
(45) Date of Patent: Apr. 25, 2023

(54) III-NITRIDE SEMICONDUCTOR DEVICE WITH NON-ACTIVE REGIONS TO SHAPE 2DEG LAYER

(71) Applicant: INNOSCIENCE (ZHUHAI) TECHNOLOGY CO., LTD., Zhuhai (CN)

(72) Inventors: Hao Li, Zhuhai (CN); Anbang Zhang, Zhuhai (CN); Jian Wang, Zhuhai (CN); Haoning Zheng, Zhuhai (CN)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 197 days.

(21) Appl. No.: 16/766,710

(22) PCT Filed: Apr. 13, 2020

(86) PCT No.: PCT/CN2020/084481
§ 371 (c)(1),
(2) Date: May 25, 2020

(87) PCT Pub. No.: WO2021/207878
PCT Pub. Date: Oct. 21, 2021

(65) Prior Publication Data
US 2022/0123106 A1    Apr. 21, 2022

(51) Int. Cl.
*H01L 29/778*    (2006.01)
*H01L 29/06*    (2006.01)
(Continued)

(52) U.S. Cl.
CPC ...... *H01L 29/0642* (2013.01); *H01L 29/0649* (2013.01); *H01L 29/402* (2013.01);
(Continued)

(58) Field of Classification Search
CPC ......... H01L 29/66431; H01L 29/66462; H01L 29/778–7789
See application file for complete search history.

(56) References Cited

U.S. PATENT DOCUMENTS

2007/0249119 A1    10/2007    Saito
2008/0296621 A1*   12/2008    Bridger ............... H01L 29/7787
                                                           257/192
(Continued)

FOREIGN PATENT DOCUMENTS

CN    110875382 A    3/2020

OTHER PUBLICATIONS

International Search Report and Written Opinion of the corresponding PCT application No. PCT/CN2020/084481 dated Jan. 13, 2021.

*Primary Examiner* — Eric A. Ward
(74) *Attorney, Agent, or Firm* — McCoy Russell LLP

(57) ABSTRACT

The present disclosure provides a semiconductor device and a fabrication method thereof. The semiconductor device includes a first III-nitride layer, a second III-nitride layer, a first contact layer, a second contact layer, a structure, and a gate layer. The second III-nitride layer is in direct contact with the first III-nitride layer. The first contact layer and the second contact layer are disposed over the second III-nitride layer. The structure is adjacent to an interface of the first III-nitride layer and the second III-nitride layer, and a material of the structure is different from a material of the first III-nitride layer or a material of the second III-nitride layer. The gate layer is disposed between the first contact layer and the second contact layer.

18 Claims, 25 Drawing Sheets

(51) Int. Cl.
*H01L 29/40* (2006.01)
*H01L 29/417* (2006.01)
*H01L 29/66* (2006.01)
H01L 29/205 (2006.01)
H01L 29/207 (2006.01)

(52) U.S. Cl.
CPC .. *H01L 29/41775* (2013.01); *H01L 29/66462* (2013.01); *H01L 29/7786* (2013.01); H01L 29/205 (2013.01); H01L 29/207 (2013.01)

(56) References Cited

U.S. PATENT DOCUMENTS

| | | |
|---|---|---|
| 2008/0303064 A1 | 12/2008 | Sato |
| 2009/0050938 A1 | 2/2009 | Miyoshi et al. |
| 2009/0108298 A1* | 4/2009 | Takagi .................. H01L 29/812 257/192 |
| 2013/0105810 A1* | 5/2013 | Nishimori ........... H01L 29/7787 257/E29.089 |
| 2013/0161638 A1* | 6/2013 | Yao .................... H01L 29/66462 257/E21.403 |
| 2014/0319582 A1 | 10/2014 | Kinoshita et al. |
| 2021/0167202 A1* | 6/2021 | Lu ....................... H01L 29/0619 |

* cited by examiner

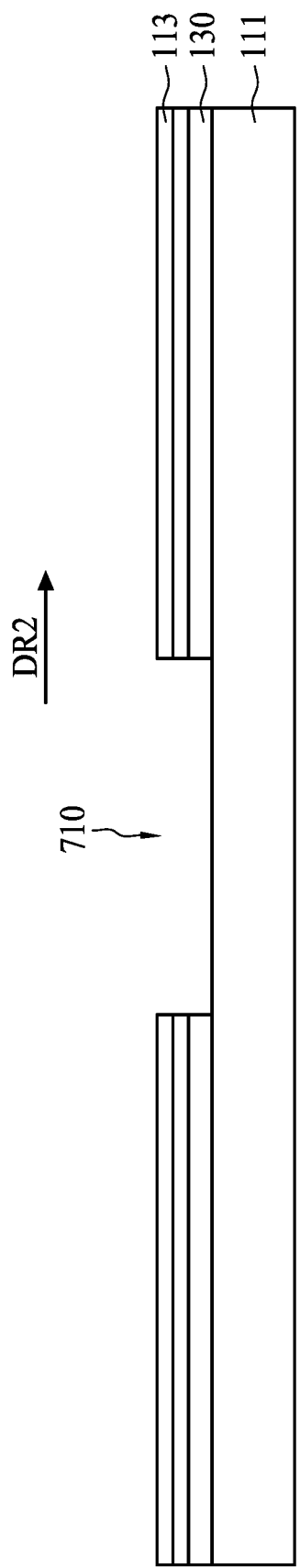

III-NITRIDE SEMICONDUCTOR DEVICE WITH NON-ACTIVE REGIONS TO SHAPE 2DEG LAYER

BACKGROUND

1. Technical Field

The present disclosure relates to a semiconductor device and a fabrication method thereof, and more particularly to a semiconductor device having III-nitride layers, contact layers, a gate layer, and a structure having a material different from that of the III-nitride layers.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a first III-nitride layer, a second III-nitride layer, a first contact layer, a second contact layer, a structure, and a gate layer. The second III-nitride layer is in direct contact with the first III-nitride layer. The first contact layer and the second contact layer are disposed over the second III-nitride layer. The structure is adjacent to an interface of the first III-nitride layer and the second III-nitride layer, and a material of the structure is different from a material of the first III-nitride layer or a material of the second III-nitride layer. The gate layer is disposed between the first contact layer and the second contact layer.

In some embodiments of the present disclosure, a semiconductor device is provided, which includes a first III-nitride layer, a second III-nitride layer, a first contact layer, a second contact layer, a plurality of structures, and a gate layer. The second III-nitride layer is in direct contact with the first III-nitride layer. The first contact layer and the second contact layer are disposed over the second III-nitride layer. The plurality of structures are between the first contact layer and the second contact layer from a top view perspective, and a material of the structures is different from a material of the first III-nitride layer or a material of the second III-nitride layer. The gate layer is disposed between the first contact layer and the second contact layer.

In some embodiments of the present disclosure, a method for manufacturing a semiconductor device is provided. The method includes forming a first III-nitride layer, forming a second III-nitride layer in direct contact with the first III-nitride layer, and forming a first contact layer and a second contact layer over the second III-nitride layer. The method for manufacturing a semiconductor device further includes forming a structure adjacent to an interface of the first III-nitride layer and the second III-nitride layer, wherein a material of the structure is different from a material of the first III-nitride layer or a material of the second III-nitride layer, and forming a gate layer between the first contact layer and the second contact layer from a top view perspective.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 8 illustrates an operation in manufacturing a semiconductor device according to some embodiments of the present disclosure.

PREFERRED EMBODIMENT OF THE PRESENT INVENTION

Figure 1A:
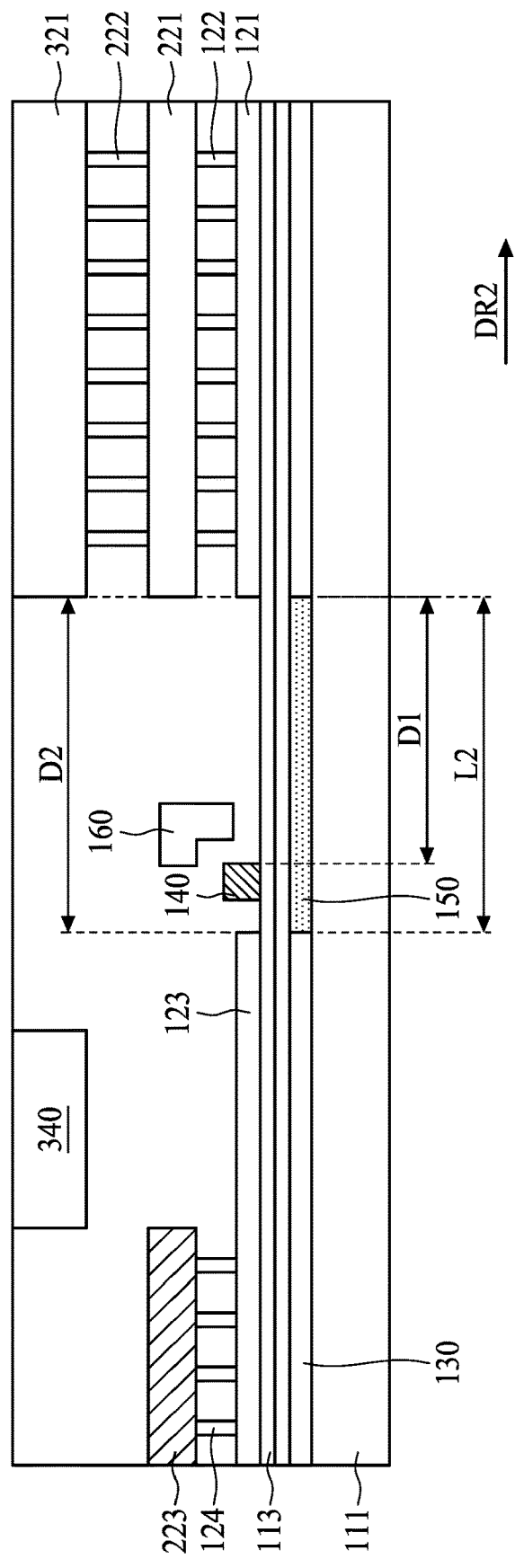
FIG. 1A is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of a semiconductor device 10 according to some embodiments of the present disclosure. In some embodiments, the semiconductor device 10 may be adopted in an RF device, such as a power RF device, but the present disclosure is not limited thereto.

As shown in FIG. 1A, the semiconductor device 10 includes a III-nitride layer 111, a III-nitride layer 113, a contact layer 121, a contact layer 123, a gate layer 140, and a structure 150.

The III-nitride layer 111 can include, without limitation, a group III nitride, for example, a compound $InxAl_yGa_{1-x-y}N$, in which x+y≤1. The group III nitride further includes, but is not limited to, for example, a compound $Al_yGa_{(1-y)}N$, in which y≤1. For example, the III-nitride layer 111 can include a GaN layer having a bandgap of about 3.4 V. In some embodiments, the III-nitride layer 111 may be disposed on a substrate (not shown in FIG. 1A). The substrate may include, without limitation, silicon (Si), doped Si, silicon carbide (SiC), germanium silicide (SiGe), gallium arsenide (GaAs), or other semiconductor materials. The substrate may include, without limitation, sapphire, silicon on insulator (SOI), or other suitable materials. In some embodiments, the substrate may further include a doped region, for example, a p-well, n-well, or the like.

The III-nitride layer 113 is in direct contact with the III-nitride layer 111. The III-nitride layer 113 can include, without limitation, a group III nitride, for example, a compound $InxAl_yGa_{1-x-y}N$, in which x+y≤1. The group III nitride further includes, but is not limited to, for example, a compound $Al_yGa_{(1-y)}N$, in which y≤1. For example, the III-nitride layer 113 can include AlGaN having a band gap of about 4.

A heterojunction is formed between the III-nitride layer 111 and the III-nitride layer 113, e.g., at an interface of the III-nitride layer 111 and the III-nitride layer 113, and the polarization of the heterojunction of different nitrides forms a two-dimensional electron gas (2DEG) layer 130 adjacent to the interface of the III-nitride layer 111 and the III-nitride layer 113. In some embodiments, the 2DEG layer 130 is formed in the III-nitride layer 111. The III-nitride layer 111 can provide or remove electrons in the 2DEG region 130, thereby controlling the conduction of the semiconductor device 10.

The contact layer 121 and the contact layer 123 are disposed over the III-nitride layer 113. In some embodiments, the contact layer 121 can serve as a drain contact, and the contact layer 123 can serve as a source contact. In some embodiments, the contact layer 121 and the contact layer 123 may include, for example, without limitation, a conductor material. The conductor materials may include, but are not limited to, for example, metals, alloys, doped semiconductor materials (e.g., doped crystalline silicon), or other suitable conductor materials.

The gate layer 140 is disposed between the contact layer 121 and the contact layer 123. The gate layer 140 is separated from the contact layer 121 by a distance D1. The gate layer 140 can include a gate metal. In some embodiments, the gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. In some embodiments, the 2DEG layer 130 formed under the gate layer 140 and is preset to be in an ON state when the gate layer 140 is in a zero bias state. Such a device can be referred to as a depletion-mode device.

The structure 150 is located between the contact layer 121 and the contact layer 123 from a top view perspective. The structure 150 may be adjacent to the interface of the III-nitride layer 111 and the III-nitride layer 113. A material of the structure 150 is different from a material of the III-nitride layer 111 or a material of the III-nitride layer 113. In some embodiments, the material of the structure 150 may include, for example, without limitation, a doped nitride semiconductor material with a dopant comprising $He^+$, $N^+$, $O^+$, $Fe^+$, $Ar^+$, $Kr^+$, or a combination thereof, a doped group III-V layer (e.g., p-GaN layer), an n-type polysilicon layer, a dielectric material, or a combination thereof.

According to some embodiments of the present disclosure, the structure 150 is adjacent to the interface of the III-nitride layer 111 and the III-nitride layer 113 where a 2DEG is supposed to be formed; thus the structure 150 can deplete the 2DEG at the region where the structure 150 is located. Thus, the structure 150 may serve to generate a non-active region where no current passes and have relatively high resistance when the semiconductor device 10 is in operation. Accordingly, with the arrangement of the structure 150 in accordance with some embodiments, one or more non-active regions can be formed at certain locations adjacent to the interface of the III-nitride layer 111 and the III-nitride layer 113, and thus the shape and/or the area of the 2DEG layer 130 can be adjusted according to various device designs. In addition, while current flows generated by 2DEG in active regions produce heat within the semiconductor device 10, the non-active region(s) generated by the structure 150 can provide an increased area for the semiconductor device 10 to dissipate heat generated from current flows. Therefore, thermal dissipation of the semiconductor device 10 is improved, reliability of the semiconductor device 10 is increased, and performance of the semiconductor device 10 is further enhanced accordingly.

In some embodiments, the structure 150 is formed in the III-nitride layer 111, the III-nitride layer 113, or both. For example, the structure 150 shown in FIG. 1A is formed in the III-nitride layer 111. In some embodiments, the structure 150 is in direct contact with the 2DEG layer 130. According to some embodiments of the present disclosure, the structure 150 is formed in the III-nitride layer 111 and/or the III-nitride layer 113 adjacent to the interface of the III-nitride layer 111 and the III-nitride layer 113, such that the generation of the heterojunction between the III-nitride layer 111 and the III-nitride layer 113 at the region where the structure 150 can be inhibited. Accordingly, the structure 150 can constrain the 2DEG flow.

In some embodiments, the structure 150 is in direct contact with the gate layer 140. In some embodiments, the structure 150 is under the gate layer 140, the contact layer 121, or both. For example, the structure 150 shown in FIG. 1A is under the gate layer 140.

In some embodiments, the structure 150 has a length L2 extending between the contact layer 121 and the contact layer 123, (e.g., extending along a direction DR2), and the length L2 of the structure 150 is equal to or smaller than a distance D2 between the contact layer 121 and the contact layer 123.

In some embodiments, the semiconductor device 10 may further include a field plate 160. The field plate 160 may be disposed between the contact layer 121 and the gate layer 140 from a top view perspective. The field plate 160 can include a conductive material. The field plate 160 can be at zero potential or connected to the contact layer 121 (e.g., drain contact) and/or the contact layer 123 (e.g., source contact). In some embodiments, the field plate 160 allows the electric field between the conductor structures (for example, the gate layer 140, the contact layer 121, and the contact layer 123) to distribute evenly, improves the tolerance to voltage, and permits the voltage to release slowly, thereby improving the device reliability. In some embodiments, the structure 150 is under the field plate 160.

In some embodiments, the semiconductor device 10 may further include metal layers 221, 223 and 321 and conductive vias 122, 222, and 124. In some embodiments, the conductive vias 122 electrically connect the contact layer 121 to the metal layer 221, and the conductive vias 222 electrically connect the metal layer 221 to the metal layer 321. In some embodiments, the conductive vias 124 electrically connect the contact layer 123 to the metal layer 223.

Figure 1B:
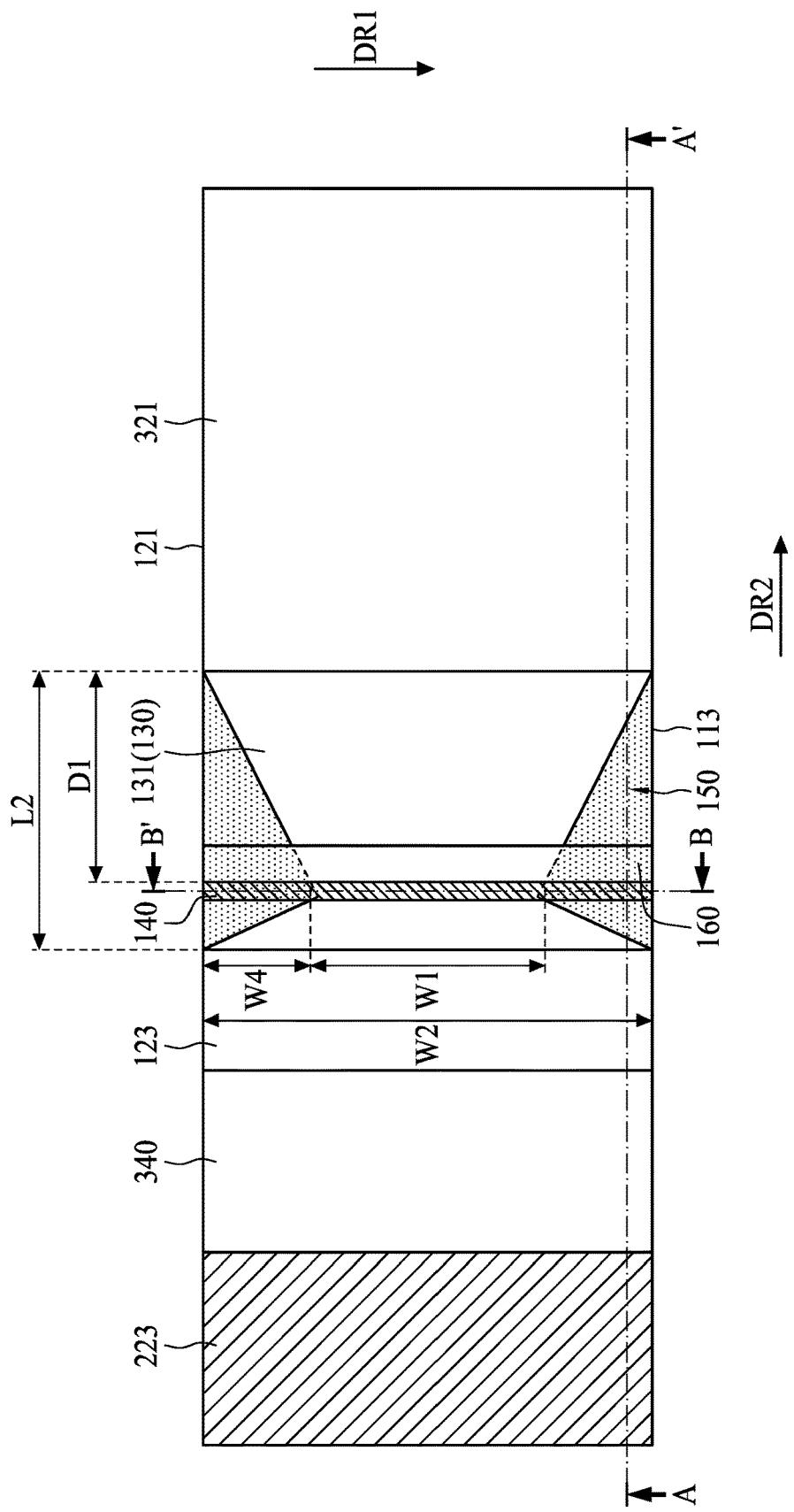
FIG. 1B is a top view of a semiconductor device according to some embodiments of the present disclosure.

FIG. 1B is a top view of a semiconductor device 10 according to some embodiments of the present disclosure. In some embodiments, the structure shown in FIG. 1A can be a cross-sectional view along the line A-A' in FIG. 1B.

In some embodiments, the 2DEG layer 130 includes a portion 131 directly contacting the structure 150. The portion 131 of the 2DEG layer 130 has a width W1 (e.g., minimum width) along a direction DR1, which is substantially perpendicular to the direction DR2, within a cell of the semiconductor device 10. In some embodiments, the width W1 of the portion 131 of the 2DEG layer 130 is smaller than a width W2 of the gate layer 140 within a cell along the direction DR1. In some embodiments, the width, along the direction DR1, of the portion 131 of the 2DEG layer 130 decreases from the contact layer 121 towards the gate layer 140 until it reaches a minimum width (e.g., width W1). While the 2DEG layer 130 has the width W1 under the gate layer 140, it renders the effective gate width of the gate layer 140 to be the width W1 that is smaller than the width W2 of the gate layer 140 within a cell. The width W1 of the portion 131 of the 2DEG layer 130 may be referred to as a current width (or effective gate width) within a cell of the semiconductor device 10.

According to some embodiments of the present disclosure, with the design of arranging a structure 150 to define an effective gate width (e.g., the width W1 of the portion 131 of the 2DEG layer 130) that is smaller than the width W2 of the gate layer 140, less amount of current flows through the channel region when the semiconductor device 10 is in operation, and thus less heat is produced. As such, heat dissipation is improved.

In addition, in accordance with some embodiments of the present disclosure, with the design of arranging a structure 150 to render the width of the 2DEG layer 130 gradually decreasing from the contact layer 121 towards the gate layer 140, the conduction resistance of the semiconductor device 10 is decreased as compared to other devices having the same effective gate widths, and thus the knee voltage of the semiconductor device 10 is decreased as well, which increases the voltage operation window and the efficiency of the semiconductor device 10.

Moreover, in some embodiments as illustrated in FIG. 1B, the 2DEG layer 130 has a maximum width along the direction DR1 adjacent to the contact layer 121 (e.g., drain contact); the resulting minimization of resistance at the contact layer 121 is advantageous to the reduction of the electrical field at the contact layer 121 (e.g., drain side), and with the relatively small effective gate width, the semiconductor device is provided with a further increased transconductance.

In some embodiments, the portion 131 of the 2DEG layer 130 is under the gate layer 140, the field plate 160, the contact layer 121, or any combination thereof. For example, the portion 131 of the 2DEG layer 130 shown in FIG. 1B is under the gate layer 140 and the field plate 160.

In some embodiments, the structure 150 has a width W4 along the direction DR1 within a cell of the semiconductor device 10, and the width W4 of the structure 150 is smaller than the width W2 of the gate layer 140 within a cell along the direction DR1. In some embodiments, the width W4 of the structure 150 is smaller than the width W1 of the portion 131 of the 2DEG layer 130 within a cell along the direction DR1. According to some embodiments of the present disclosure, the width W4 of the structure 150 may be referred to as a non-action region having relatively high resistance, the width W1 of the portion 131 of the 2DEG layer 130 may be referred to as the current path, and the width W4 being smaller than the width W1 can provide heat dissipation effects without sacrificing desired electrical performance of the semiconductor device 10.

In some embodiments, a ratio of the width W1 of the portion 131 of the 2DEG layer 130 to the width W4 of the structure 150 is about 2 to about 20.

According to some embodiments of the present disclosure, the ratio of the width W1 of the portion 131 of the 2DEG layer 130 to the width W4 of the structure 150 is critical to the heat dissipation and electrical performance of the semiconductor device 10. In some embodiments, if the ratio is less than 2, the effective gate width may be too small, and the current flowing through the channel region may be insufficient to provide satisfactory electrical performance of the semiconductor device 10. On the other hand, in some embodiments, if the ratio is greater than 20, the non-active region may be too small to provide sufficient heat dissipation effects.

Figure 2A:
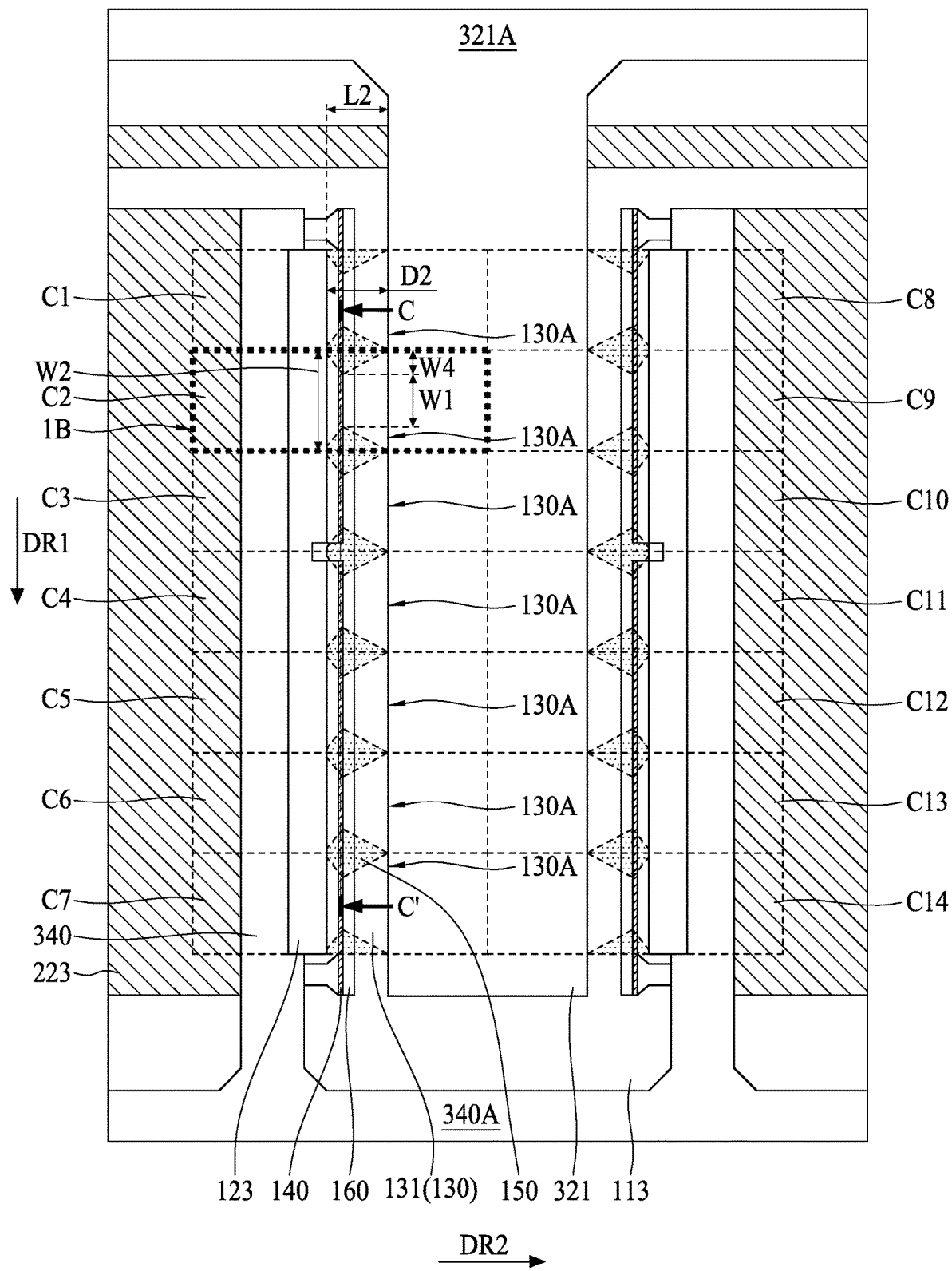
FIG. 2A is a top view of a semiconductor device according to some embodiments of the present disclosure.

FIG. 2A is a top view of a semiconductor device 1 according to some embodiments of the present disclosure. In some embodiments, the structure shown in FIG. 1B can be a partial structure in the dashed line box 1B of FIG. 2A.

As shown in FIG. 2A, in some embodiments, the semiconductor device 1 includes a plurality of the structures 150 between the contact layer 121 and the contact layer 123 from a top view perspective. In some embodiments, the structures 150 are arranged in substantially parallel to the gate layer 140, for example, along the direction DR1. According to some embodiments of the present disclosure, the structures 150 are arranged between the contact layer 121 and the contact layer 123 and extend along the gate layer 140 (also may referred to as "gate finger"), such that the design of the structures 150 of the present disclosure can be widely applied in various "gate finger-type" semiconductor devices. Accordingly, the existing manufacturing processes and structures in the industry do not require massive modifications to adopt the design of the structures 150 of the present disclosure; the manufacturing cost is thereby reduced, and the adoption of the design into current procedures is convenient.

In some embodiments, the semiconductor device 1 includes a plurality of cells (e.g., cells C1-C7 and C8-C14), and the cells are arranged in substantially parallel to the gate layer 140. In some embodiments, the structures 150 are located between the cells of the semiconductor device 1. In some embodiments, the structures 150 are in direct contact with the 2DEG layer 130.

According to some embodiments of the present disclosure, the structures 150 where no current flows through are dispersed between the cells of the semiconductor device 1, such that regions (e.g., structures 150) with relatively low thermal concentration are spread dispersedly, and thus the heat dissipation throughout the cells is improved.

In some embodiments, the 2DEG layer 130 includes a plurality of 2DEG regions 130A. The 2DEG regions 130A may be arranged in substantially parallel to the gate layer 140. For example, the 2DEG regions 130A may be arranged along the direction DR1. In some embodiments, the structures 150 and the 2DEG regions 130A are interlacedly arranged along the direction DR1 that is in substantially parallel to the gate layer 140. According to some embodiments of the present disclosure, the 2DEG regions 130A are distributed diversely and separated by the regions (e.g., structures 150) with relatively low thermal concentration, and thus the thermal concentration of the heat generated when the semiconductor device 1 is in operation is dispersed, greatly increasing the heat dissipation effects.

In some embodiments, as shown in FIG. 2A, the two structures 150 corresponding to two adjacent cells are connected to each other. In some embodiments, the 2DEG regions 130A each corresponding to each of the cells are separated from one another by the structures 150 located between the cells.

In some embodiments, the semiconductor device 1 further includes a gate bus 340 and a gate pad 340A. In some embodiments, the gate bus 340 extends in substantially parallel to the gate layer 140, and the gate bus 340A connects the gate layer 140 to the gate pad 340A. In some embodiments, the semiconductor 1 further includes a contact pad 321A (e.g., drain pad). In some embodiments, the metal layer 321 connects to the contact pad 321A.

Figure 2B:
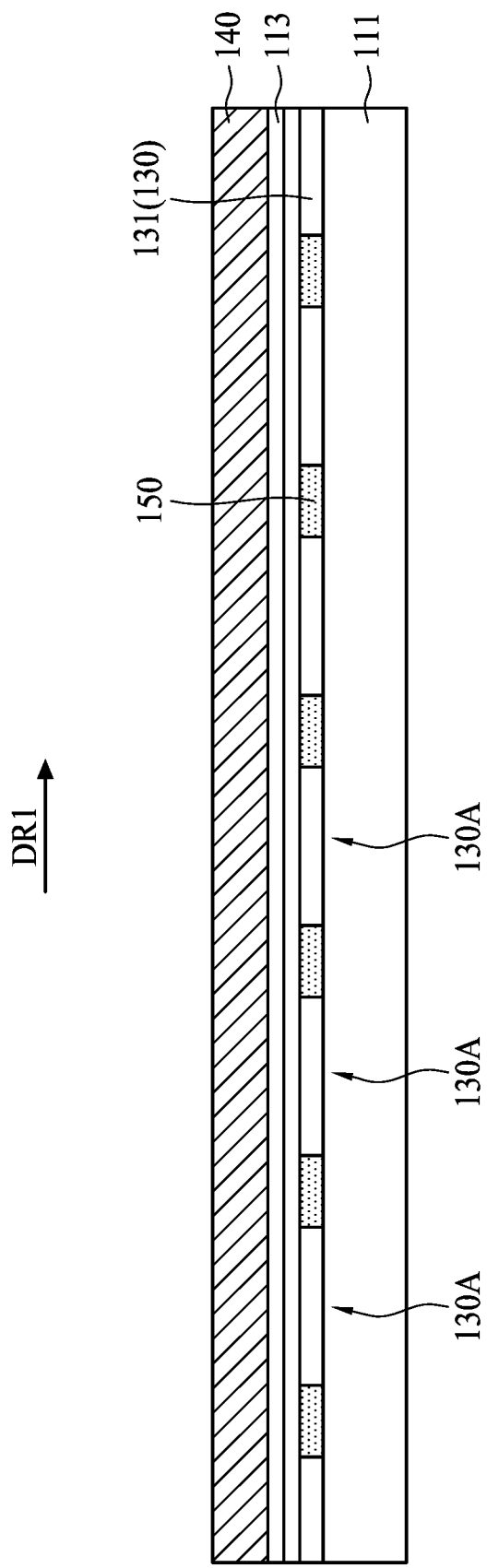
FIG. 2B is a cross-sectional view along the line C-C' in FIG. 2A according to some embodiments of the present disclosure.

FIG. 2B is a cross-sectional view along the line C-C' in FIG. 2A according to some embodiments of the present disclosure.

As shown in FIG. 2B, in some embodiments, the portion 131 of the 2DEG layer 130 is in direct contact with the structures 150, and the structures 150 are arranged in substantially parallel to and under the gate layer 140. In some embodiments, the 2DEG regions 130A are separated from one another by the structures 150.

Figure 3A:
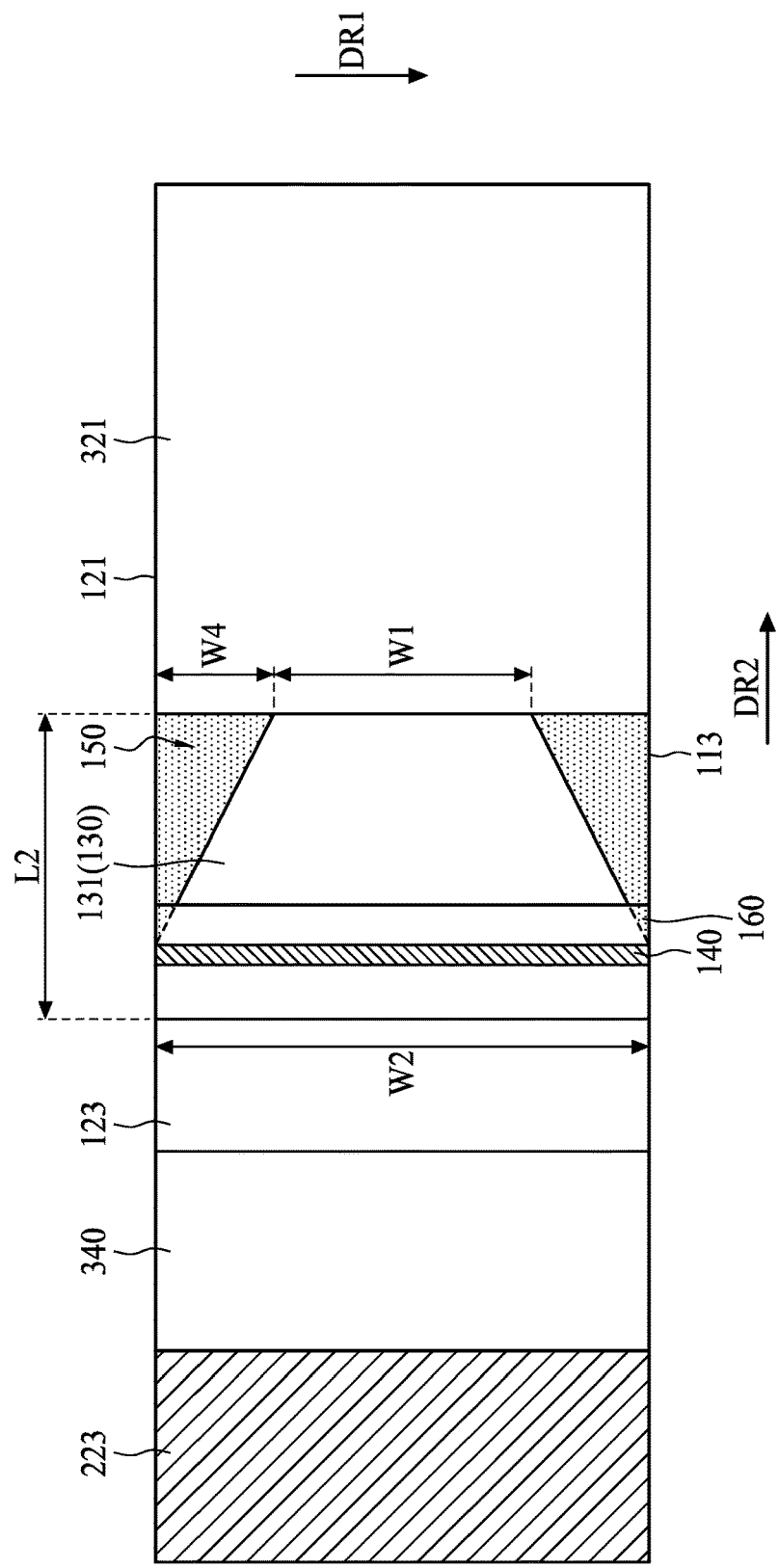
FIG. 3A is a top view of a semiconductor device according to some embodiments of the present disclosure.

FIG. 3A is a top view of a semiconductor device 10A according to some embodiments of the present disclosure. The semiconductor device 10A has a structure similar to the semiconductor device 10 shown in FIG. 1A and/or FIG. 1B, except that the structure 150 is under the contact layer 121. According to some embodiments of the present disclosure, the portion 131 of the 2DEG layer 130 has a maximum width along the direction DR1 adjacent to the gate layer 140, and thus the resulting minimization of resistance at the gate layer 140 is advantageous to the reduction of the electrical field at the gate layer 140.

Figure 3B:
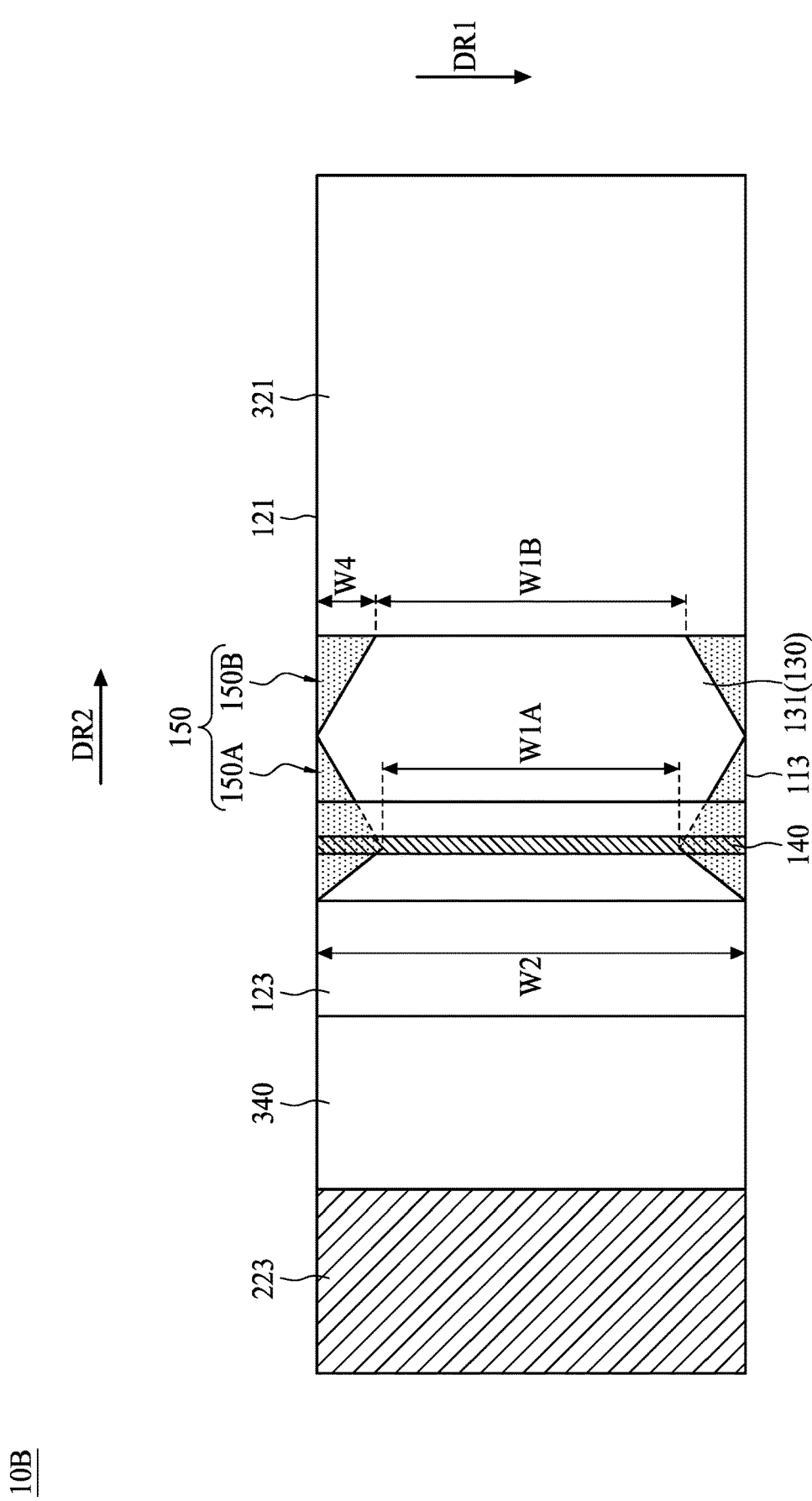
FIG. 3B is a top view of a semiconductor device according to some embodiments of the present disclosure.

FIG. 3B is a top view of a semiconductor device 10B according to some embodiments of the present disclosure. The semiconductor device 10B has a structure similar to the semiconductor device 10 shown in FIG. 1A and/or FIG. 1B, except that the structure 150 includes portions 150A and 150B, respectively, under the gate layer 140 and the contact layer 121.

In some embodiments, the portions 150A and 150B within a cell of the semiconductor device 10B are separated from each other by the portion 131 of the 2DEG layer 130. In some embodiments, the portions 150A and 150B within a cell of the semiconductor device 10B have a total length L2 along the direction DR2. In some embodiments, the portion 150A has a width W1A along the direction DR1, the portion 150B has a width W1B along the direction DR1, and the widths W1A and W1B are smaller than the width W2 of the gate layer 140. In some embodiments, the width W1A of the portion 150A may be the same as or different from the width W1B of the portion 150B.

Figure 3C:
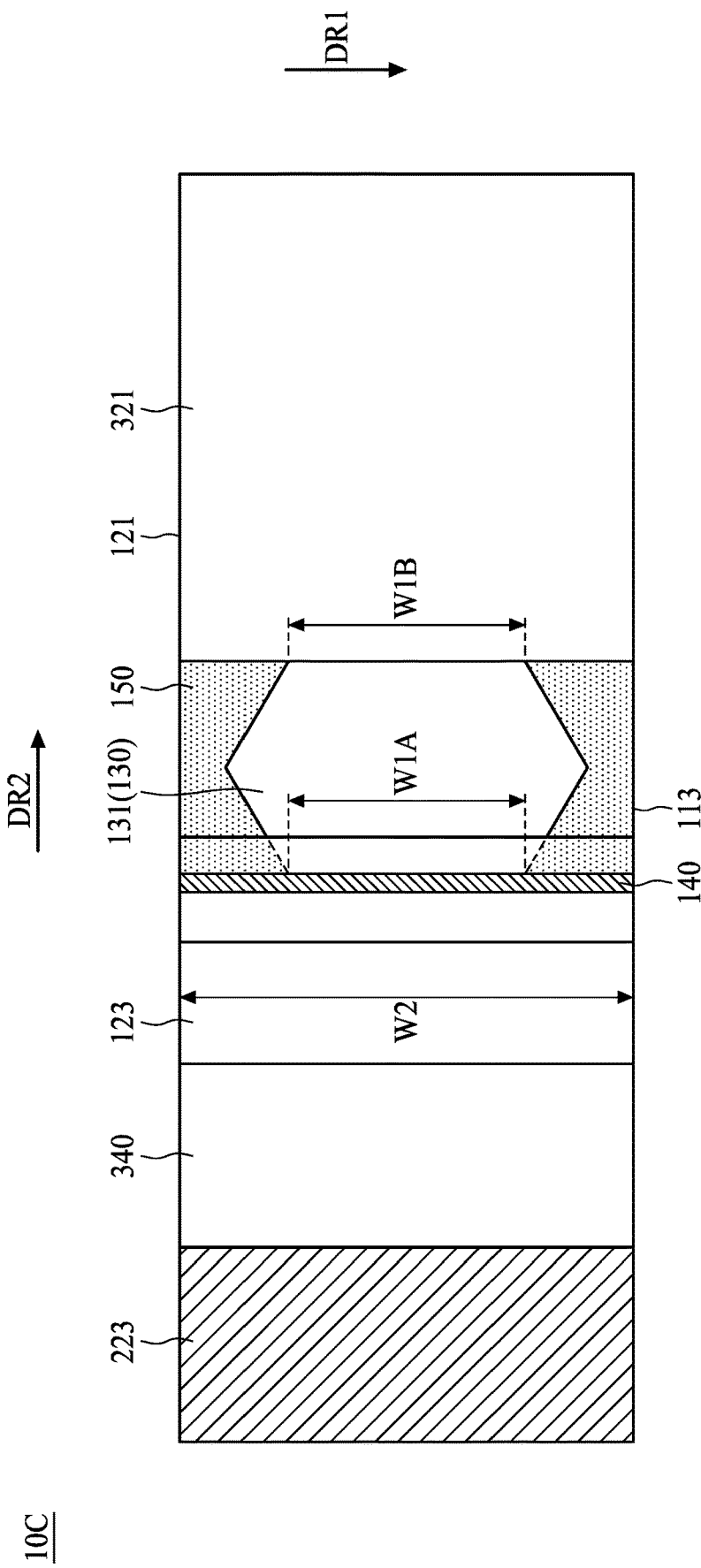
FIG. 3C is a top view of a semiconductor device according to some embodiments of the present disclosure.

FIG. 3C is a top view of a semiconductor device 10C according to some embodiments of the present disclosure. The semiconductor device 10C has a structure similar to the semiconductor device 10B shown in FIG. 3B except that the portion of the structure 150 under the gate layer 140 is connected to the portion of the structure 150 under the contact layer 121.

Figure 3D:
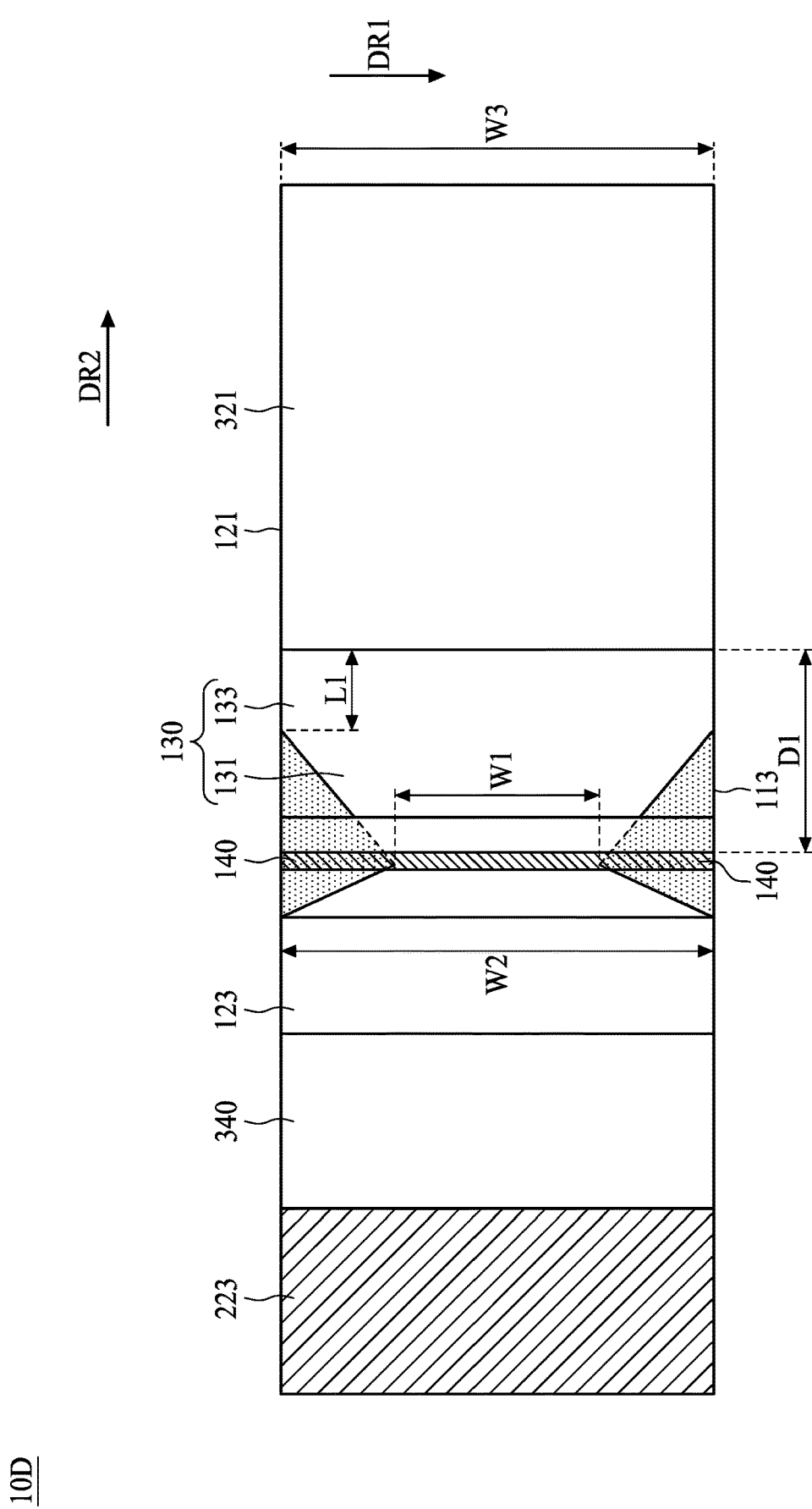
FIG. 3D is a top view of a semiconductor device according to some embodiments of the present disclosure.

FIG. 3D is a top view of a semiconductor device 10D according to some embodiments of the present disclosure. The semiconductor device 10D has a structure similar to the semiconductor device 10 shown in FIG. 1A and/or FIG. 1B, except that the 2DEG layer 130 further includes a portion 133 connected to the portion 131.

In some embodiments, the portion 133 of the 2DEG layer 130 has a width W3 along the direction DR1, and the width W3 of the portion 133 is substantially equal to the width W2 of the gate layer 140. In some embodiments, the portion 133 has a length L1 extending along the direction DR2, and the length L1 of the portion 133 is smaller than the distance D1 between the contact layer 121 and the gate layer 140. According to some embodiments of the present disclosure, the design of the portion 133 that has a relatively large area adjacent to the contact layer 121 (e.g., drain side) can reduce the conduction resistance in the drift region and increase the breakdown voltage of the semiconductor device 10D.

In some embodiments, the portion 133 of the 2DEG layer 130 is under the contact layer 121. In some embodiments, the structure 150 is under the gate layer 140.

Figure 3E:
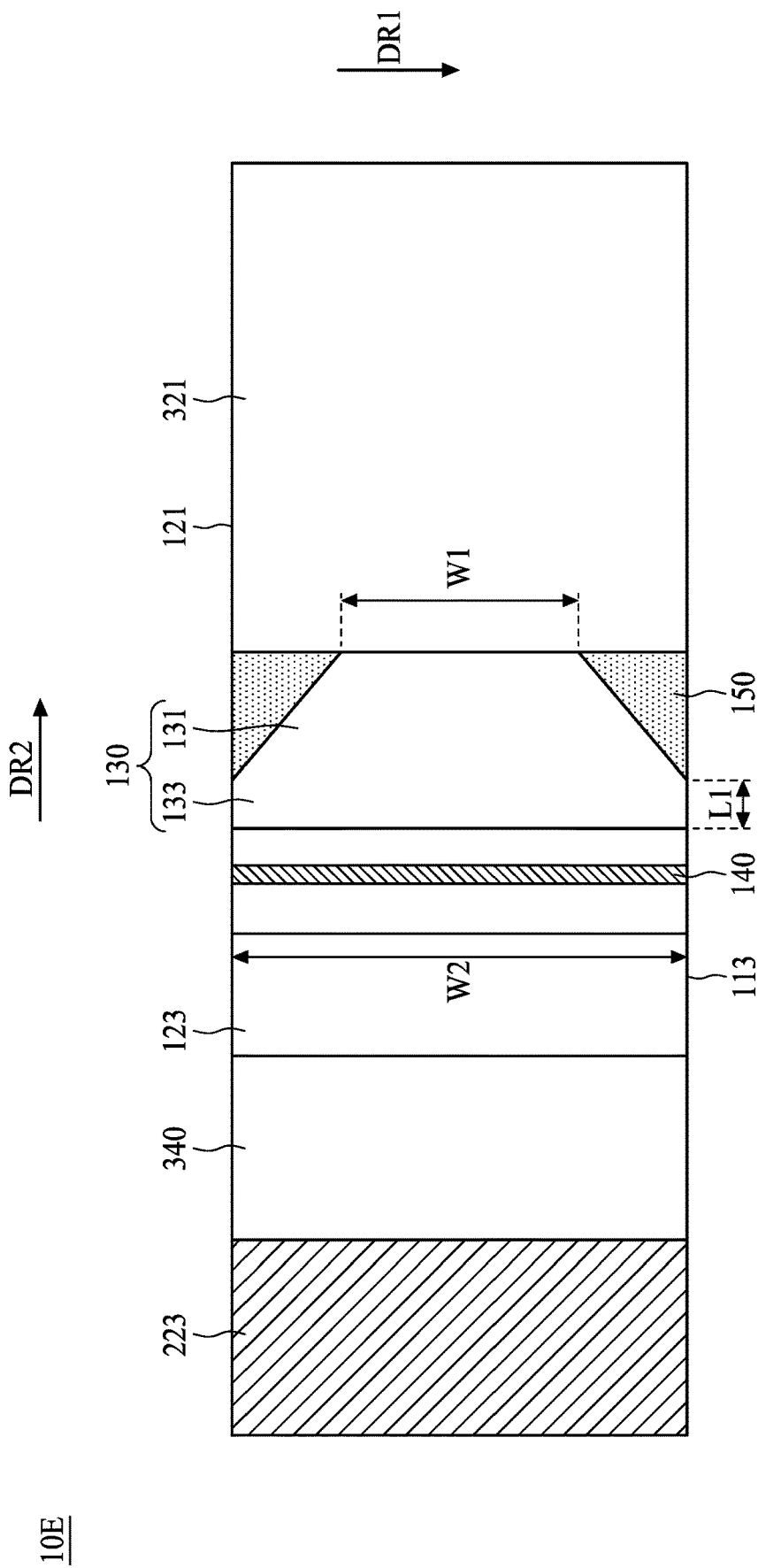
FIG. 3E is a top view of a semiconductor device according to some embodiments of the present disclosure.

FIG. 3E is a top view of a semiconductor device 10E according to some embodiments of the present disclosure. The semiconductor device 10E has a structure similar to the semiconductor device 10D shown in FIG. 3D except that the structure 150 is under the contact layer 121. In some embodiments, the portion 133 of the 2DEG layer 130 is under the gate layer 140.

According to some embodiments of the present disclosure, the design of the portion 133 that has a relatively large area adjacent to the gate layer 140 can increase the breakdown voltage of the semiconductor device 10E. In addition, according to some embodiments of the present disclosure, the portion 133 of the 2DEG layer 130 has a maximum width along the direction DR1 adjacent to the gate layer 140, and thus the resulting minimization of resistance at the gate layer 140 is advantageous to the reduction of the electrical field at the gate layer 140.

Figure 3F:
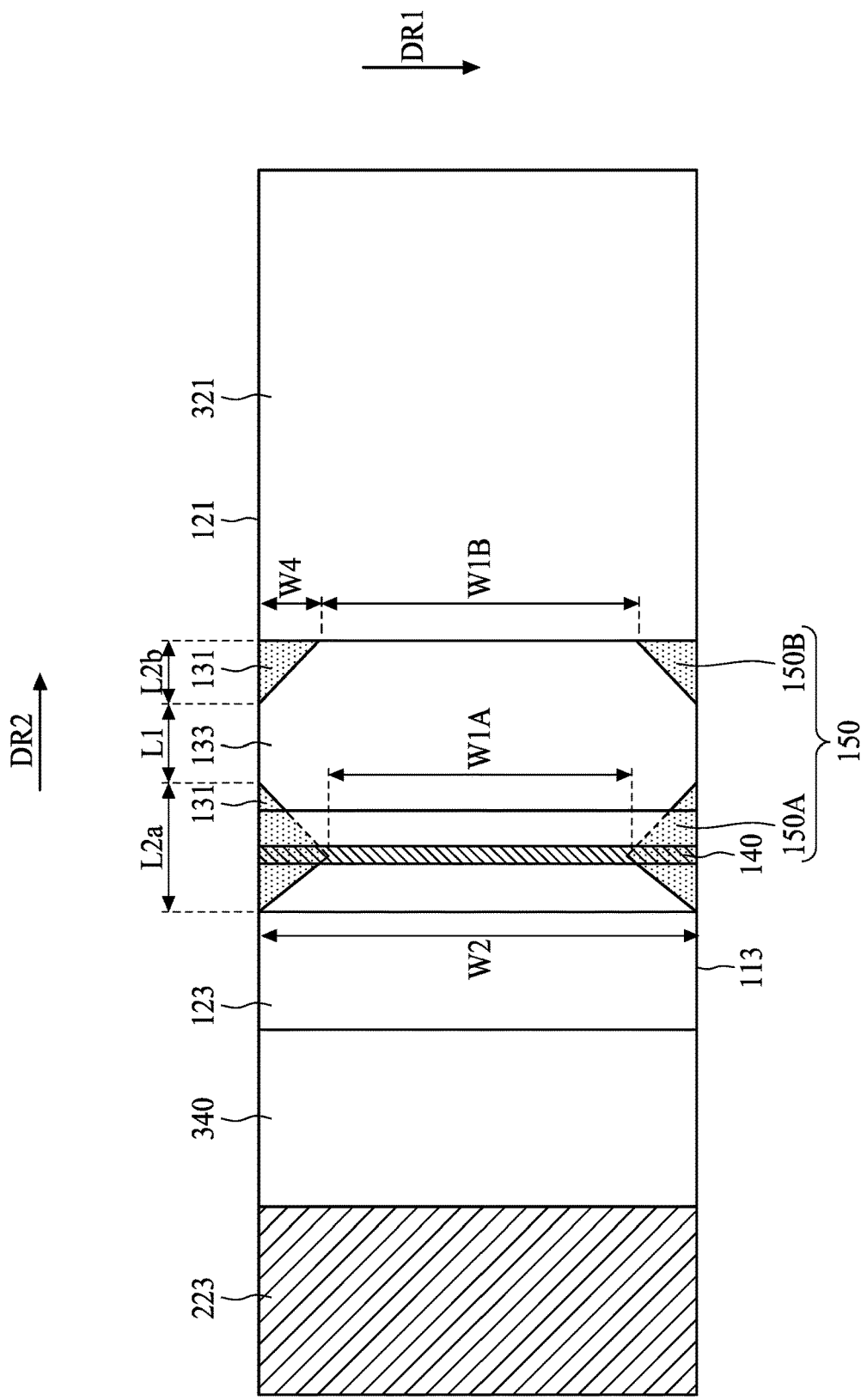
FIG. 3F is a top view of a semiconductor device according to some embodiments of the present disclosure.

FIG. 3F is a top view of a semiconductor device 10F according to some embodiments of the present disclosure. The semiconductor device 10F has a structure similar to the semiconductor device 10B shown in FIG. 3B, except that the 2DEG layer 130 further includes a portion 133 connected to the portion 131, and the portions 150A and 150B within a cell of the semiconductor device 10F are separated from each other by the portion 133 of the 2DEG layer 130. In some embodiments, the sum of a length L2a of the portion 150A and a length L2b of the portion 150B within a cell of the semiconductor device 10F along the direction DR2 is equal to or smaller than the distance D2 between the contact layer 121 and the contact layer 123. According to some embodiments of the present disclosure, the design of the portion 133 that has a relatively large area can increase the breakdown voltage of the semiconductor device 10F.

Figure 3G:
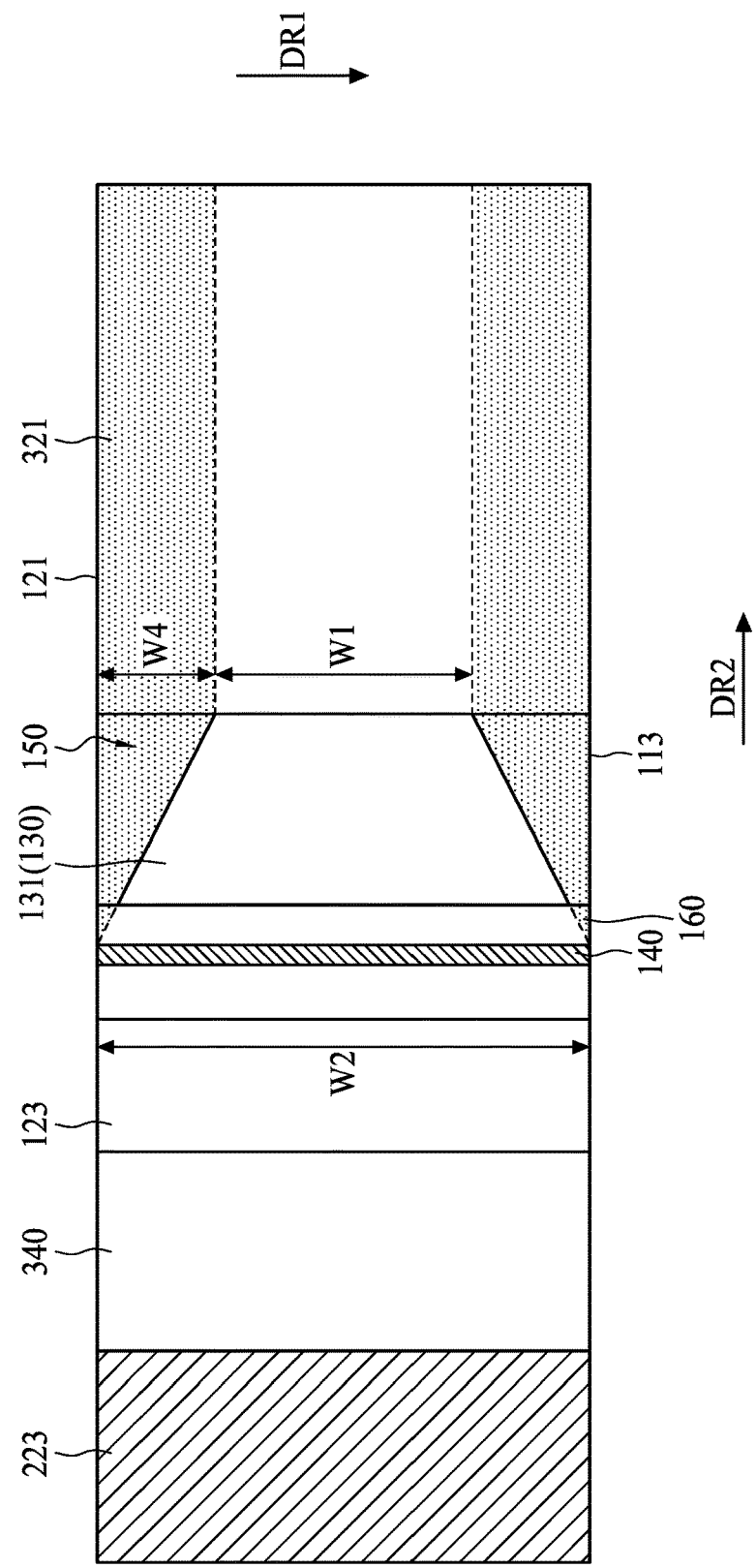
FIG. 3G is a top view of a semiconductor device according to some embodiments of the present disclosure.

FIG. 3G is a top view of a semiconductor device 10A1 according to some embodiments of the present disclosure. The semiconductor device 10A1 has a structure similar to the semiconductor device 10A shown in FIG. 3A, except that the structure 150 further extends under the contact layer 121.

Figure 3H:
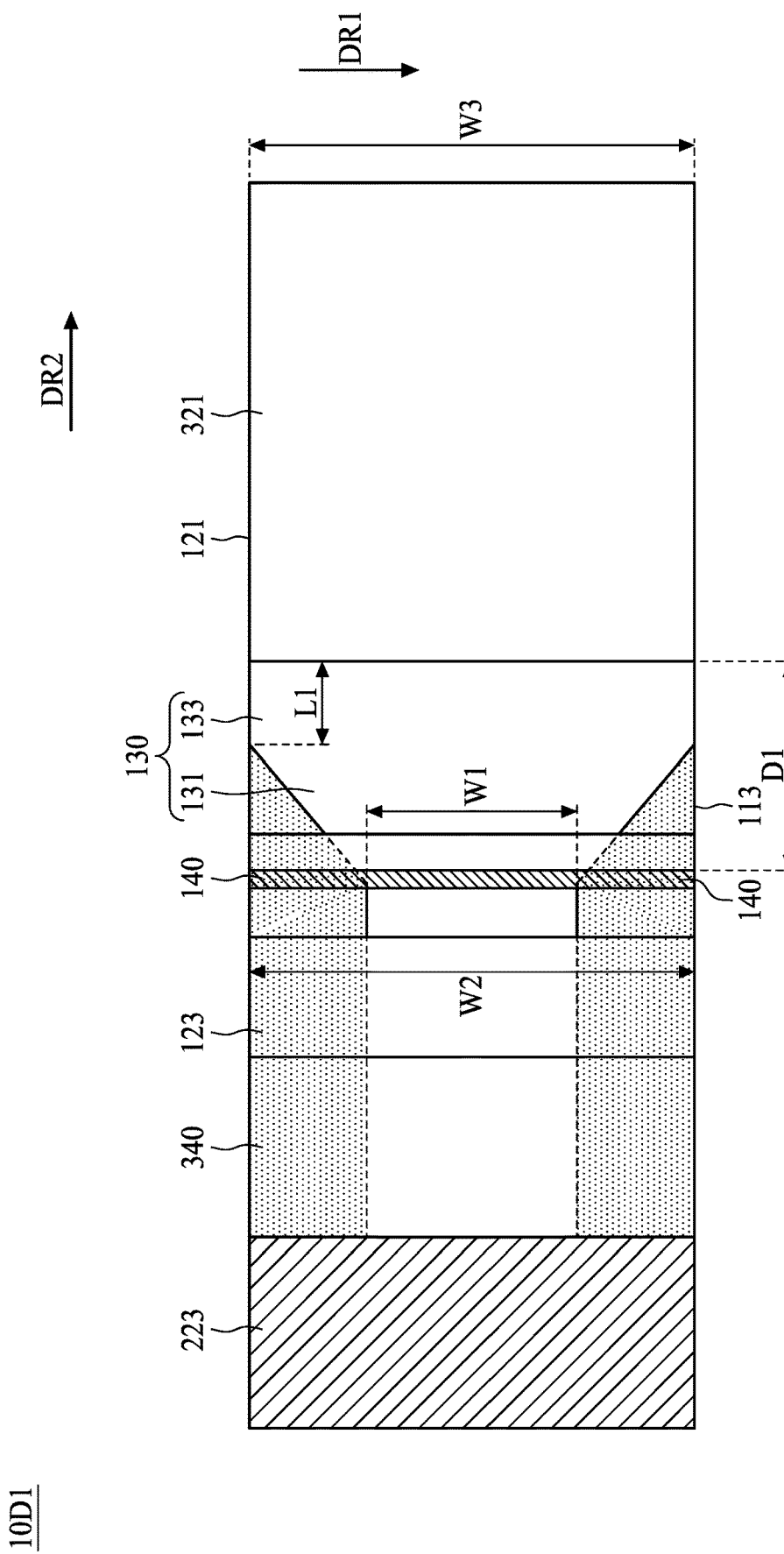
FIG. 3H is a top view of a semiconductor device according to some embodiments of the present disclosure.

FIG. 3H is a top view of a semiconductor device 10D1 according to some embodiments of the present disclosure. The semiconductor device 10D1 has a structure similar to the semiconductor device 10D shown in FIG. 3D, except that the structure 150 further extends under the contact layer 123. In some embodiments, the structure 150 may further extend under the metal layer 223. In some embodiments, the structure 150 may further extend under the contact layer 121 and the contact layer 123.

Figure 4A:
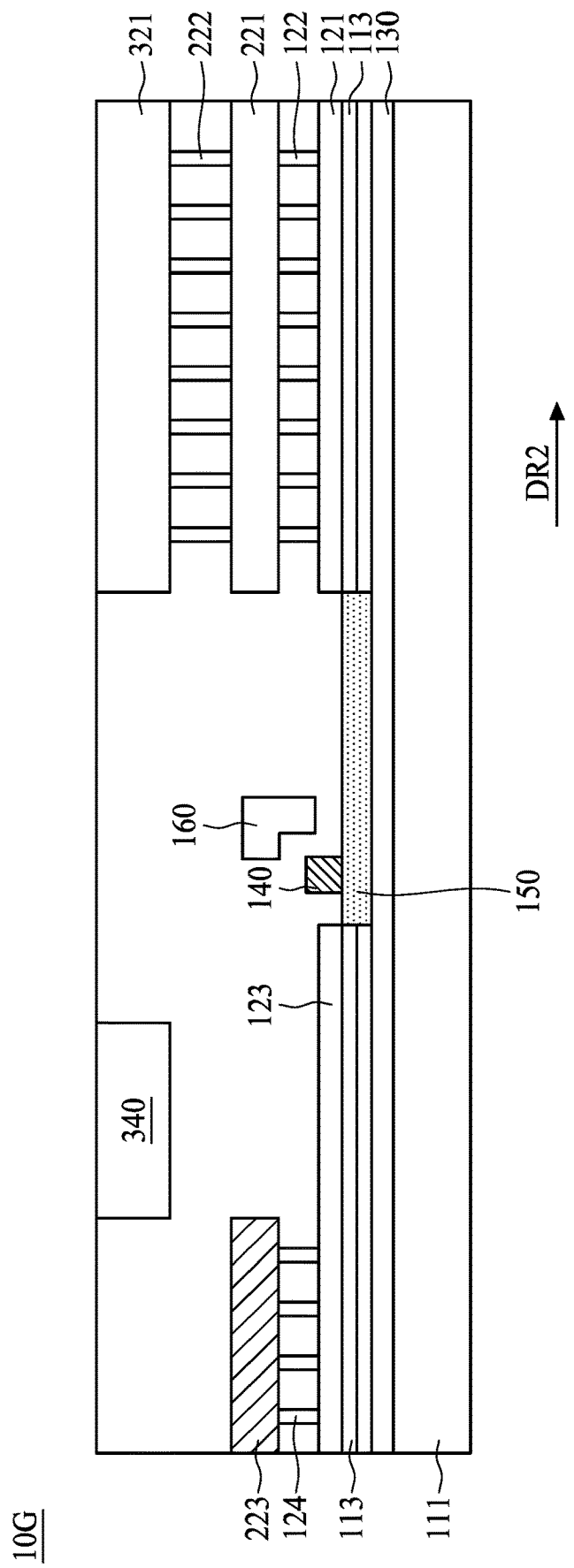
FIG. 4A is a cross-sectional view of a semiconductor device according to some embodiments of the present disclosure.

FIG. 4A is a cross-sectional view of a semiconductor device 10G according to some embodiments of the present disclosure. The semiconductor device 10G has a structure similar to the semiconductor device 10 shown in FIG. 1A, except that the structure 150 is formed in the III-nitride layer 113.

Figure 4B:
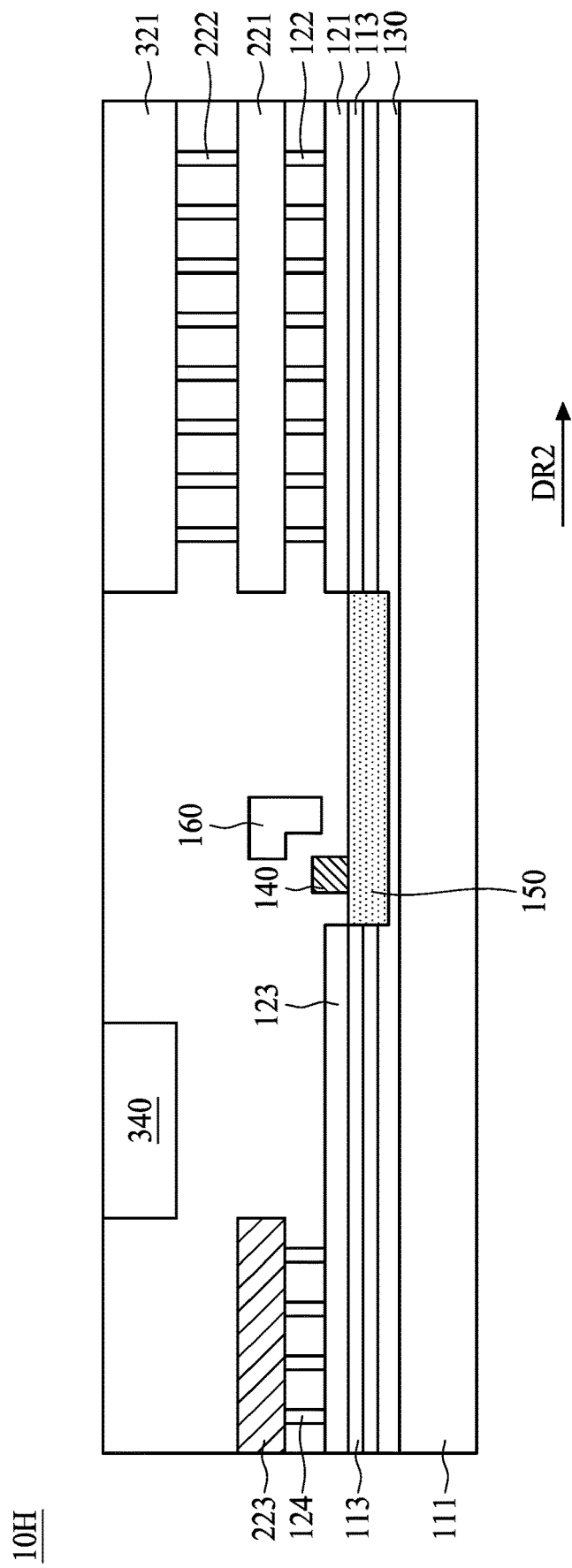
FIG. 4B is a cross-sectional view of a semiconductor device according to some embodiments of the present disclosure.

FIG. 4B is a cross-sectional view of a semiconductor device 10H according to some embodiments of the present disclosure. The semiconductor device 10H has a structure similar to the semiconductor device 10 shown in FIG. 1A, except that the structure 150 is formed in the III-nitride layer 111 and the III-nitride layer 113. In some embodiments, a bottom portion of the structure 150 is embedded in the 2DEG layer 130. According to some embodiments of the present disclosure, the structure 150 has a relatively small thickness and may not penetrate through the 2DEG layer 130; that is, the 2DEG may be insufficiently depleted at the region where the structure 150 is located. With such arrangement of the structure 150, in accordance with some embodiments of the present disclosure, the heat dissipation effects of the semiconductor device and the current amount within the 2DEG layer 130 may reach a certain balance according to various device designs.

Figure 4C:
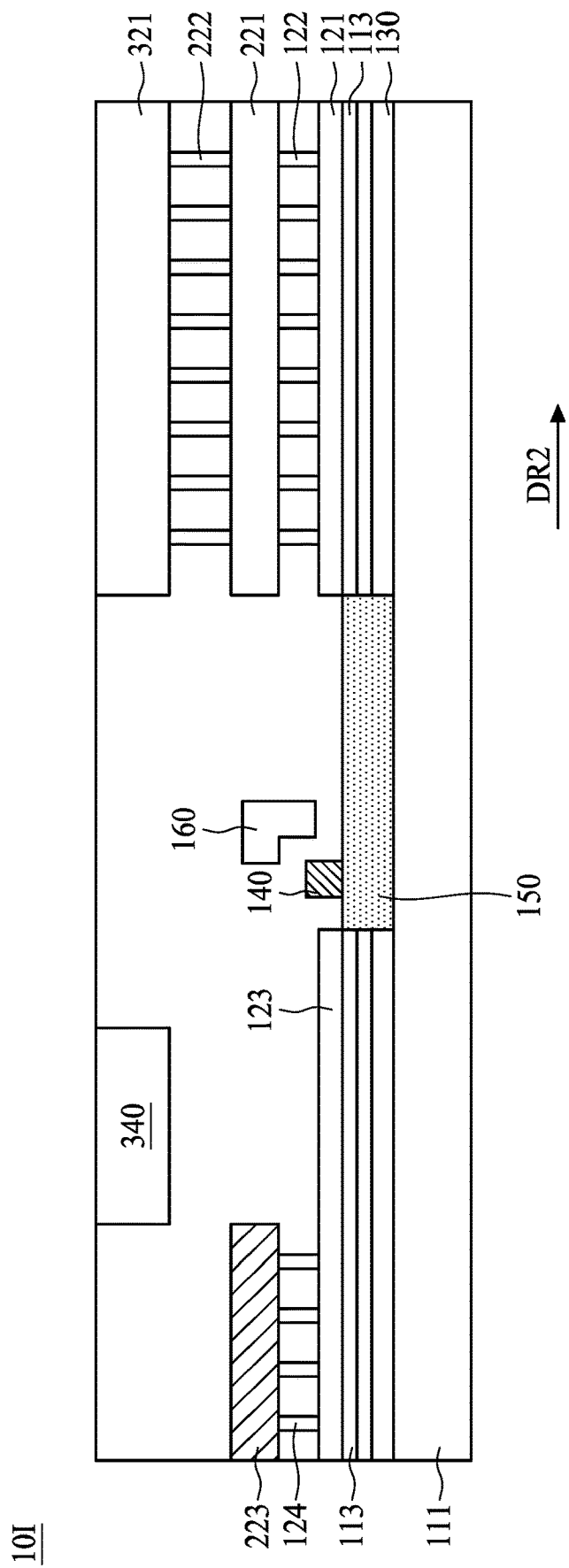
FIG. 4C is a cross-sectional view of a semiconductor device according to some embodiments of the present disclosure.

FIG. 4C is a cross-sectional view of a semiconductor device 10I according to some embodiments of the present disclosure. The semiconductor device 10I has a structure similar to the semiconductor device 10H shown in FIG. 4B, except that the structure 150 passes through the 2DEG layer 130.

Figure 4D:
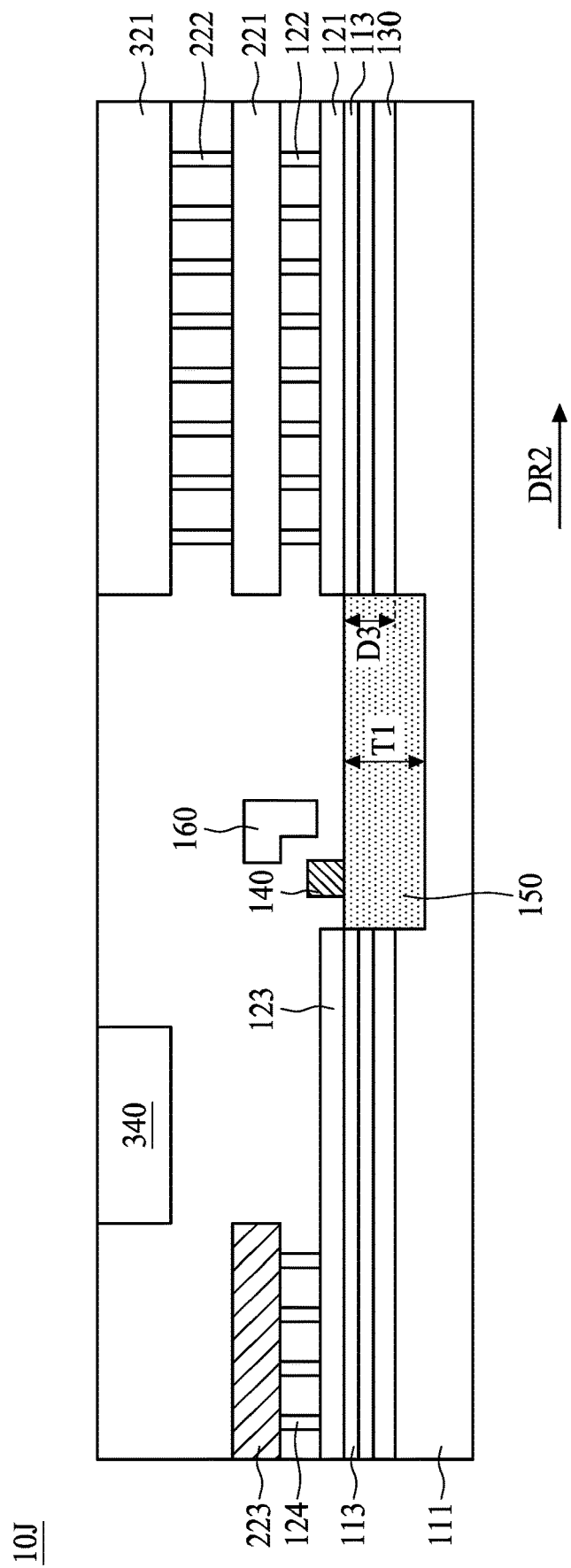
FIG. 4D is a cross-sectional view of a semiconductor device according to some embodiments of the present disclosure.

FIG. 4D is a cross-sectional view of a semiconductor device 10J according to some embodiments of the present disclosure. The semiconductor device 10J has a structure similar to the semiconductor device 10I shown in FIG. 4C, except that the structure 150 penetrates deeper than the 2DEG layer 130. In some embodiments, a thickness T1 of the structure 150 is greater than a distance D3 between the contact layer 121 and a lower boundary of the 2DEG layer 130.

Figure 4E:
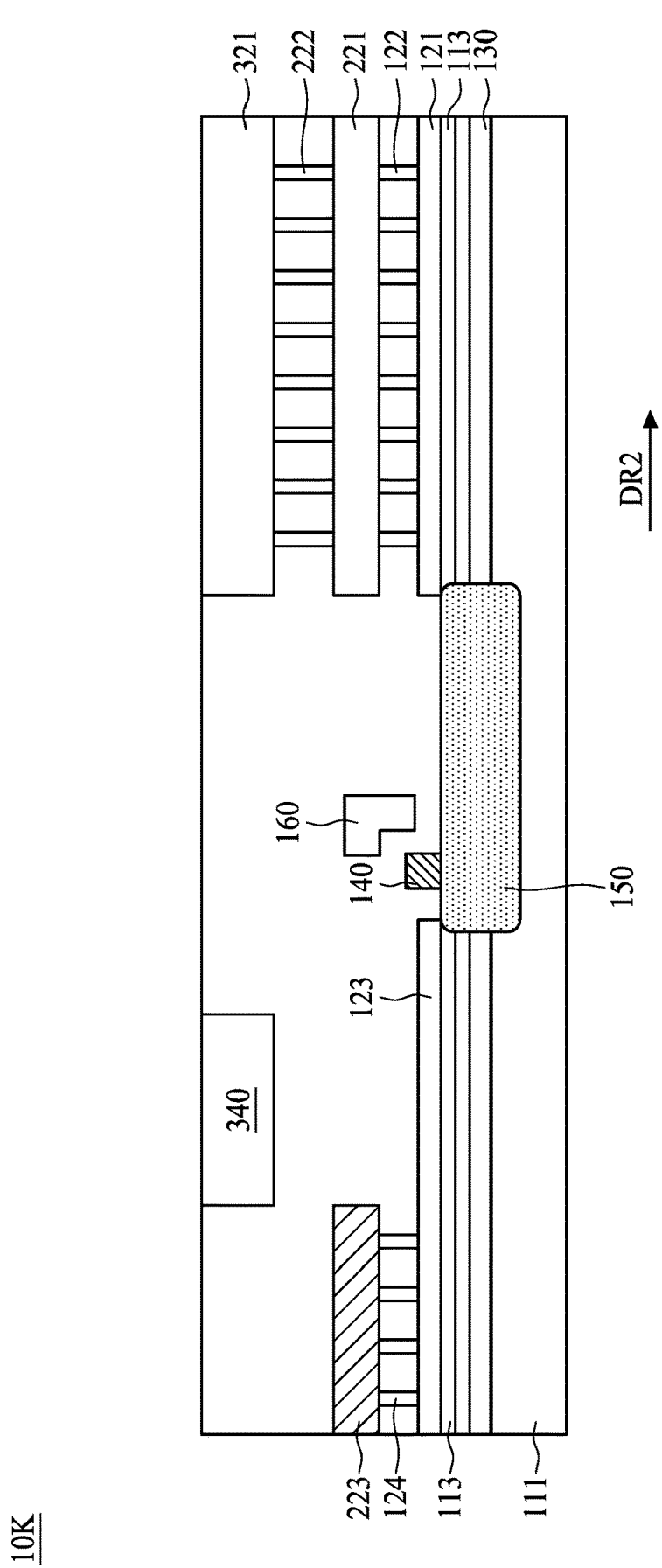
FIG. 4E is a cross-sectional view of a semiconductor device according to some embodiments of the present disclosure.

FIG. 4E is a cross-sectional view of a semiconductor device 10K according to some embodiments of the present disclosure. The semiconductor device 10K has a structure similar to the semiconductor device 10J shown in FIG. 4D, except that a portion of the structure 150 is under the contact layer 121 and/or the contact layer 123.

Figure 5A:
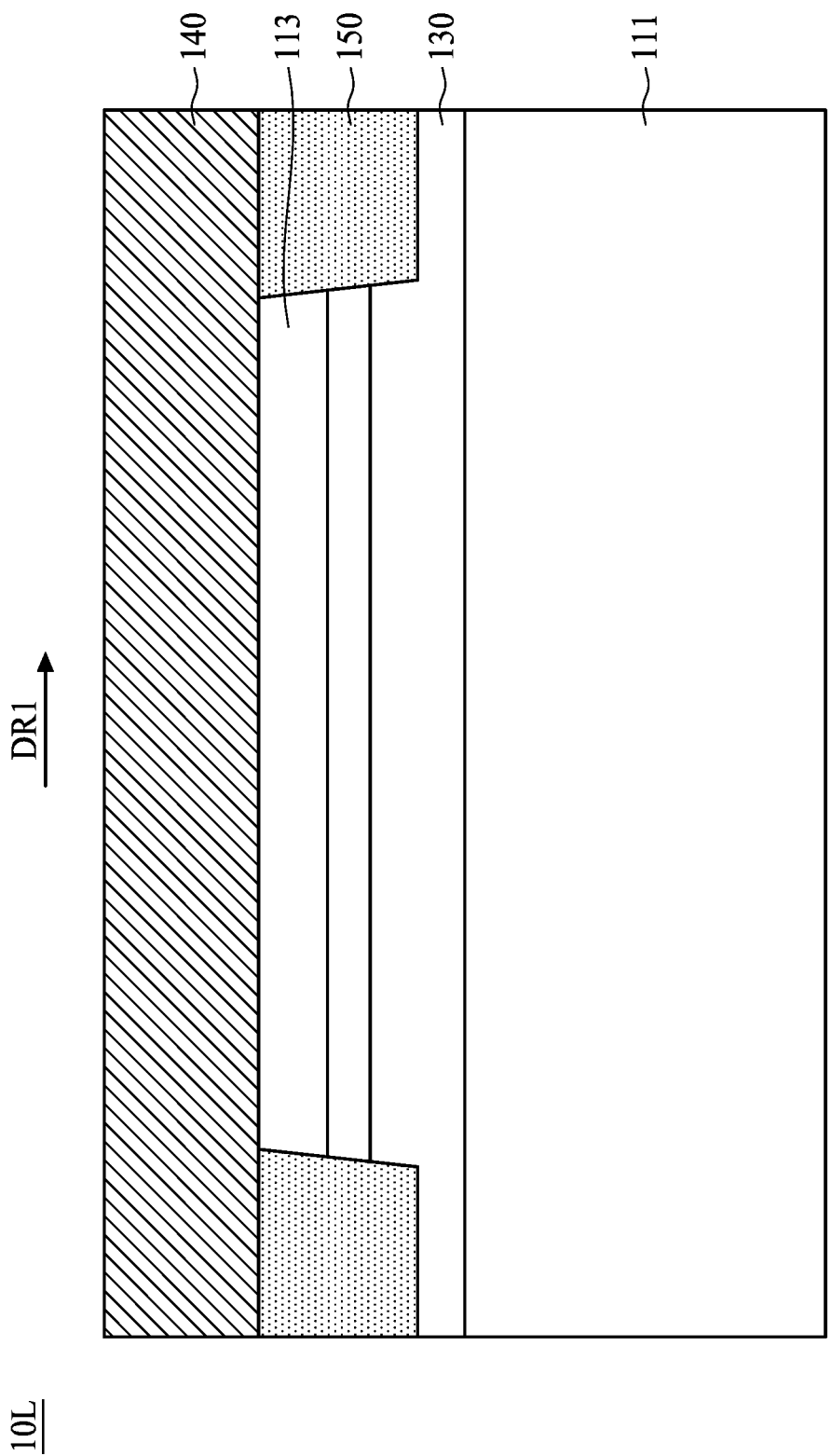
FIG. 5A is a cross-sectional view of a semiconductor device according to some embodiments of the present disclosure.

FIG. 5A is a cross-sectional view of a semiconductor device 10L according to some embodiments of the present disclosure. In some embodiments, the structure shown in FIG. 5A can be a cross-sectional view along the line B-B' in FIG. 1B.

As shown in FIG. 5A, in some embodiments, the structure 150 is formed in the III-nitride layer 111 and the III-nitride layer 113. In some embodiments, a bottom portion of the structure 150 is embedded in the 2DEG layer 130.

Figure 5B:
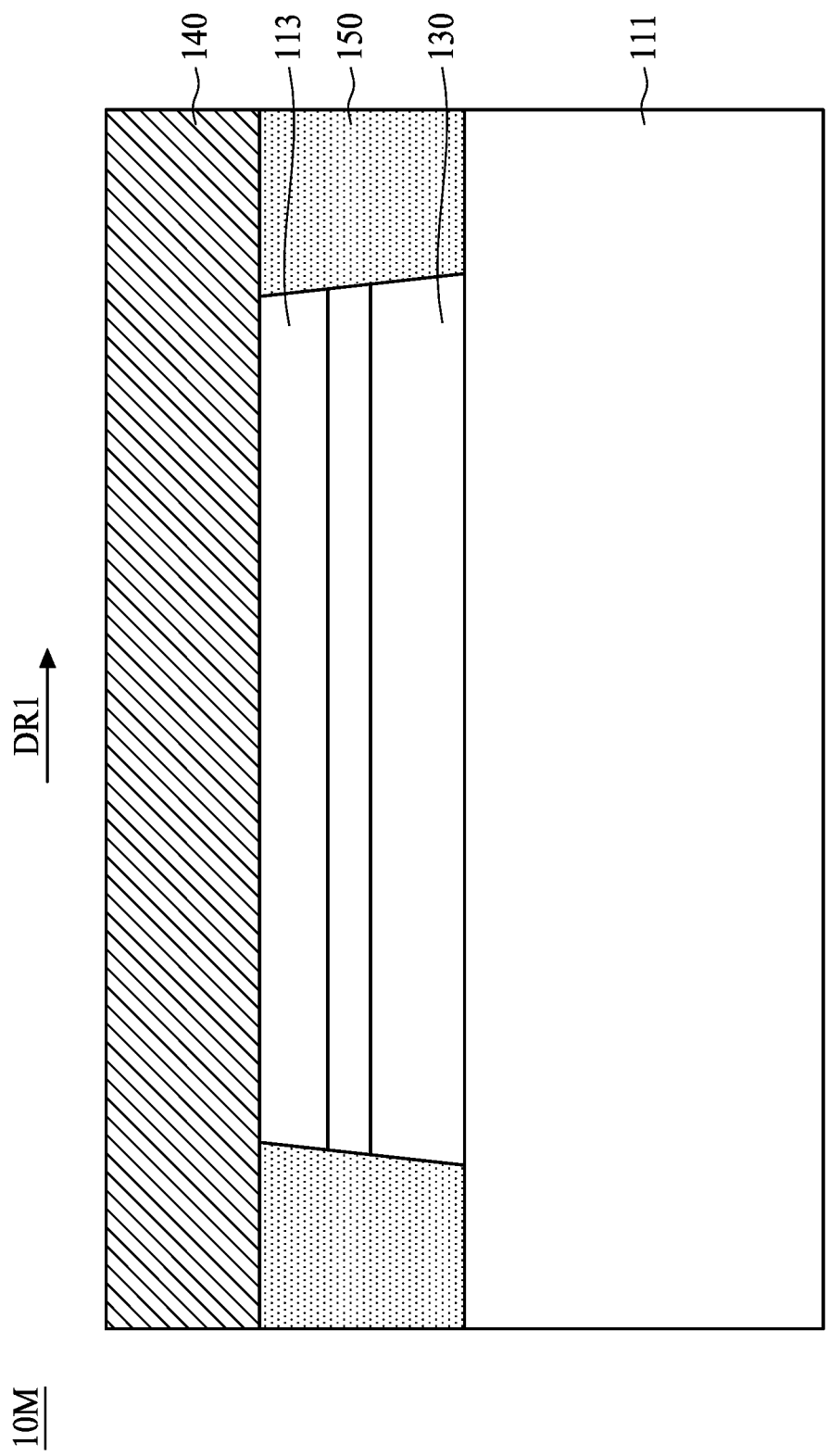
FIG. 5B is a cross-sectional view of a semiconductor device according to some embodiments of the present disclosure.

FIG. 5B is a cross-sectional view of a semiconductor device 10M according to some embodiments of the present disclosure. The semiconductor device 10M has a structure similar to the semiconductor device 10L shown in FIG. 5A, except that the structure 150 passes through the 2DEG layer 130.

Figure 5C:
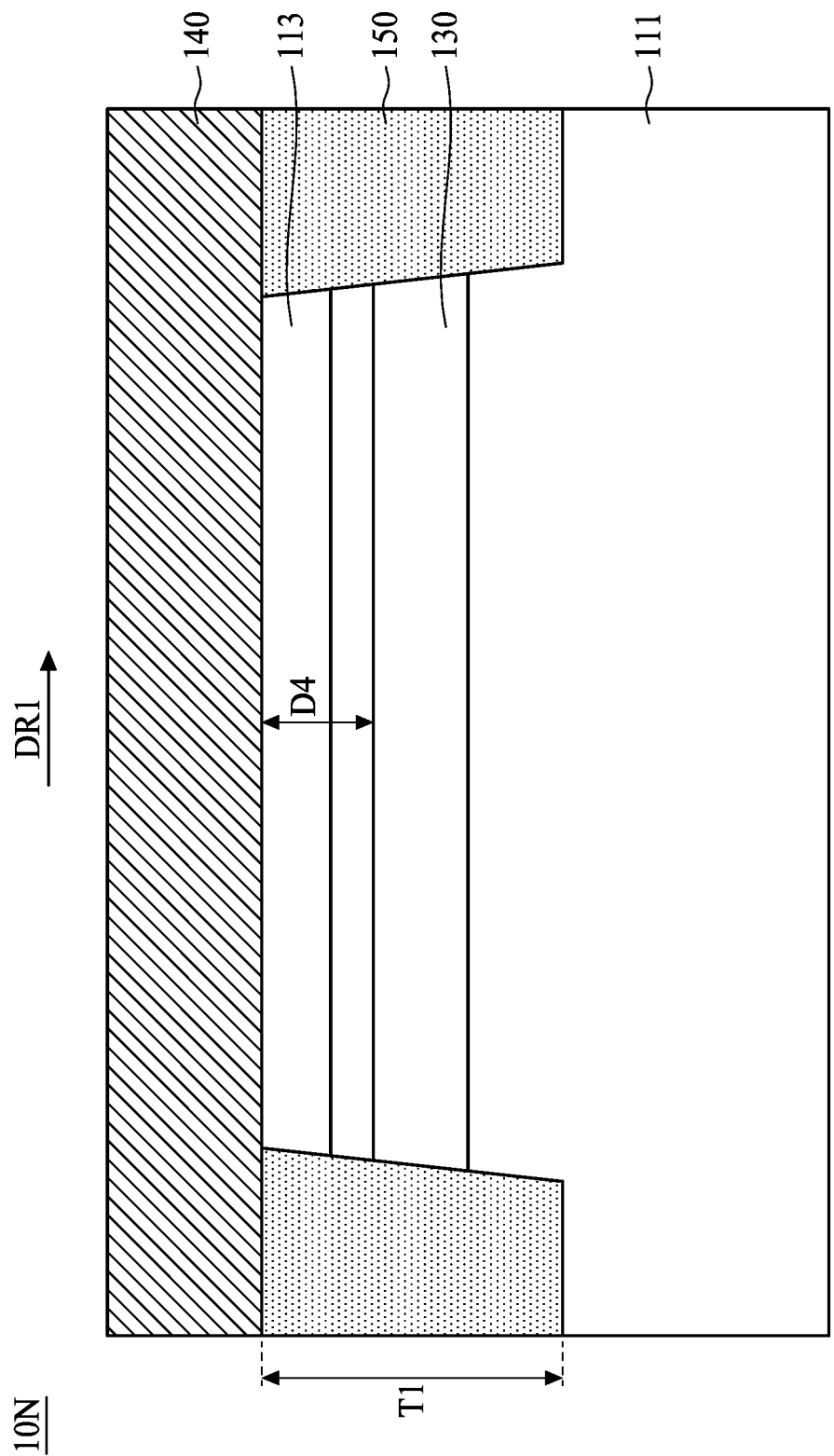
FIG. 5C is a cross-sectional view of a semiconductor device according to some embodiments of the present disclosure.

FIG. 5C is a cross-sectional view of a semiconductor device 10N according to some embodiments of the present disclosure. The semiconductor device 10N has a structure similar to the semiconductor device 10M shown in FIG. 5B, except that the structure 150 penetrates deeper than the 2DEG layer 130. In some embodiments, the thickness T1 of the structure 150 is greater than a distance D4 between the gate layer 140 and a lower boundary of the 2DEG layer 130.

Figure 5D:
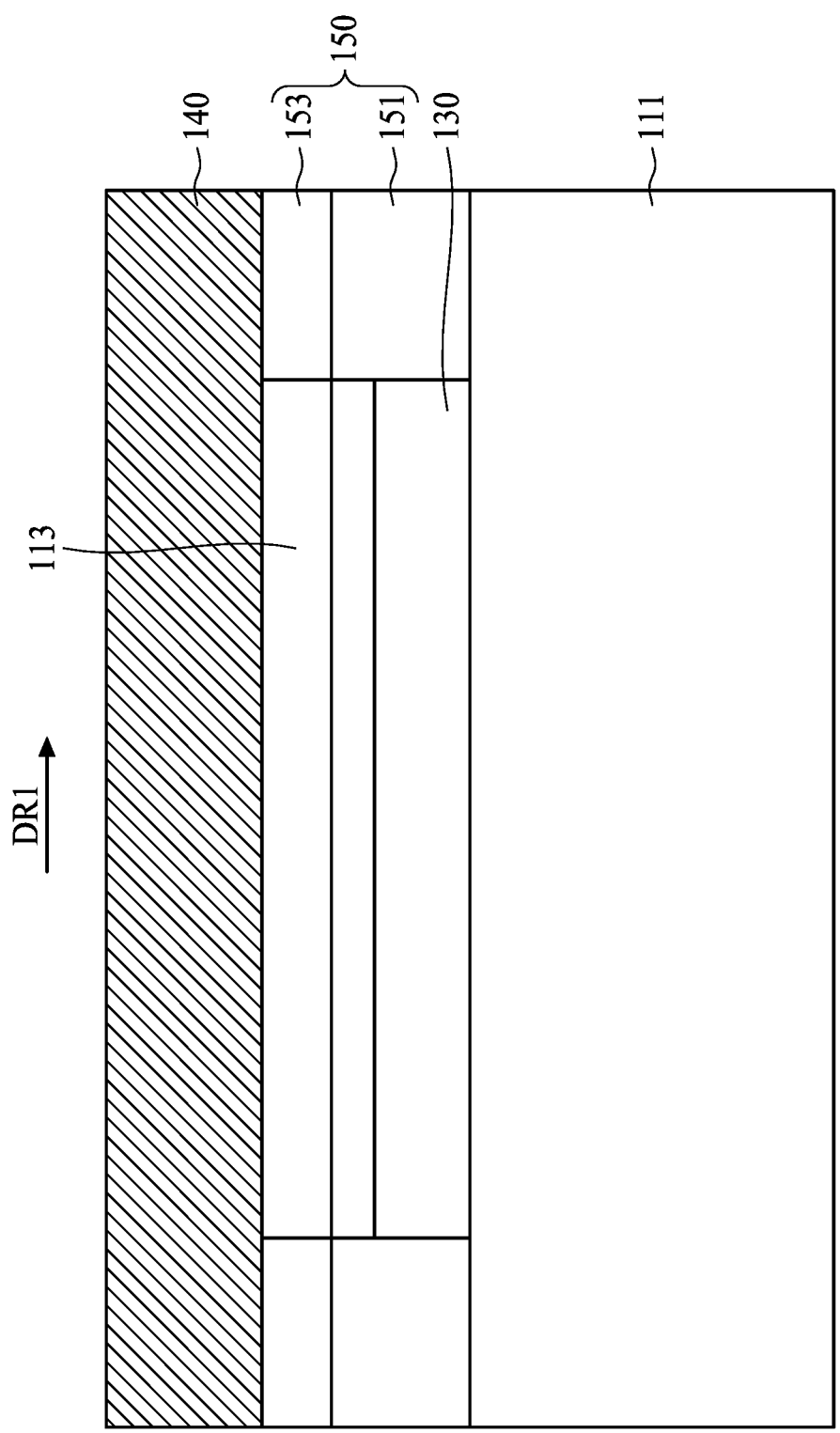
FIG. 5D is a cross-sectional view of a semiconductor device according to some embodiments of the present disclosure.

FIG. 5D is a cross-sectional view of a semiconductor device 10P according to some embodiments of the present disclosure. The semiconductor device 10P has a structure similar to the semiconductor device 10M shown in FIG. 5B, except that the structure 150 includes layers 151 and 153.

In some embodiments, the layer 151 is a doped group III-V layer (e.g., p-GaN layer), and the layer 153 is a dielectric layer. The layer 151 may be formed of one or more materials having a polarity opposite to that of the III-nitride layer 113, such that a heterojunction cannot be formed between the III-nitride layer 111 and the layer 151, generating a non-active region. In some embodiments, the gate layer 140 is in direct contact with the III-nitride layer 113 and the layer 153. In some embodiments, the gate layer 140 is isolated from the layer 151 (e.g., p-GaN layer) by the layer 153 (e.g., dielectric layer).

Figure 6:
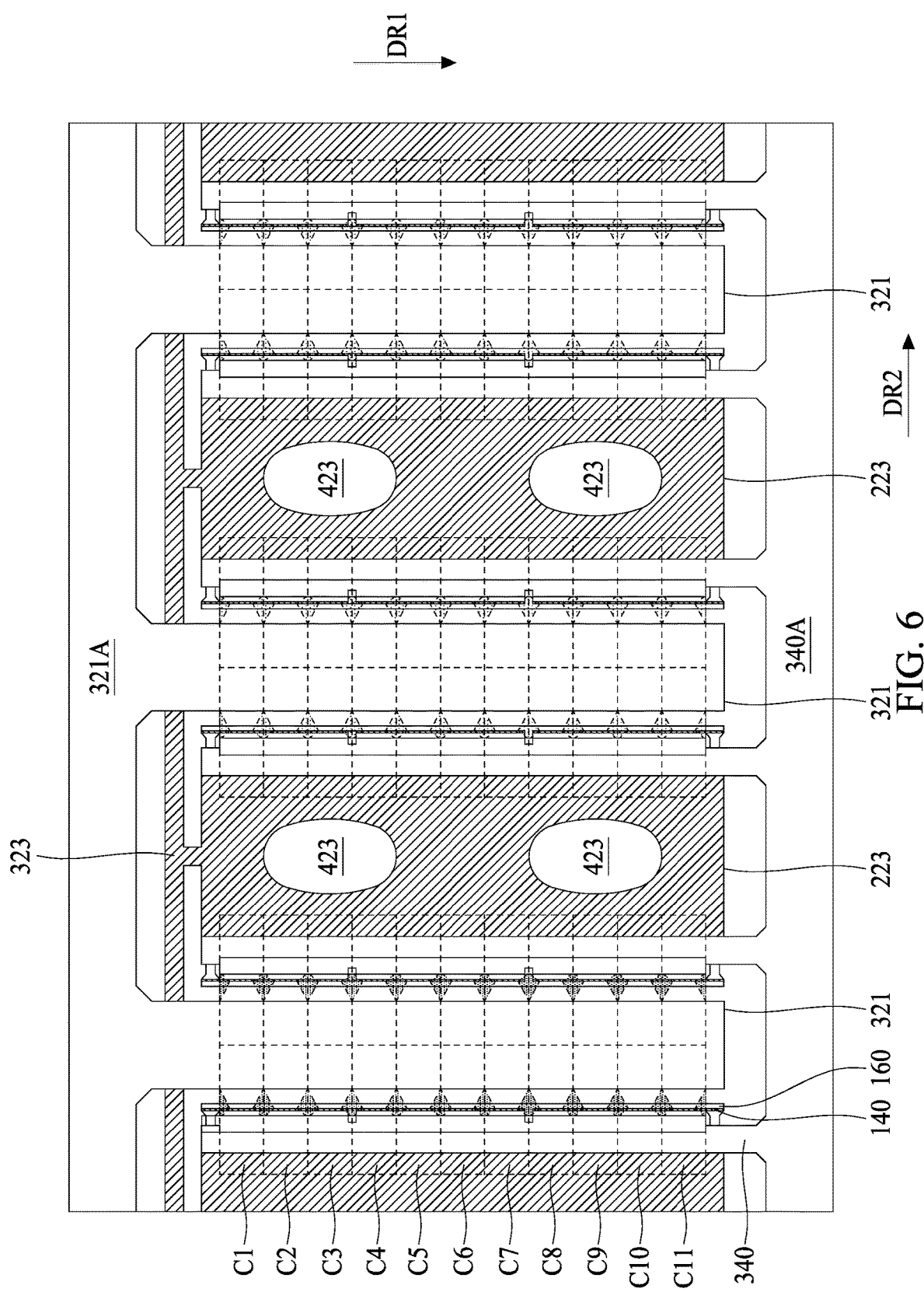
FIG. 6 is a top view of a semiconductor device according to some embodiments of the present disclosure.

FIG. 6 is a top view of a semiconductor device 2 according to some embodiments of the present disclosure. In some embodiments, the structure shown in FIG. 2A can be a partial structure included in the structure shown in FIG. 6.

As shown in FIG. 6, in some embodiments, the semiconductor device 2 includes a plurality of cells (e.g., cells C1-C11 and etc.), and the cells are arranged in substantially parallel to the gate layer 140. In some embodiments, the structures 150 are arranged in substantially parallel to the gate layer 140, for example, along the direction DR1. In some embodiments, the structures 150 are located between the cells of the semiconductor device 2.

In some embodiments, the semiconductor device 2 further includes a contact bus 323 and contact plugs 423. In some embodiments, the contact bus 323 can serve as a source contact bus, and the contact plugs 423 can serve as source contact plugs. In some embodiments, the contact bus 323 extends in substantially perpendicular to the gate layer 140. In some embodiments, the contact bus 323 connects the metal layers 223 to one another. In some embodiments, the metal layer 223 connects the contact layer 123 to the contact plugs 423.

Figure 7A:
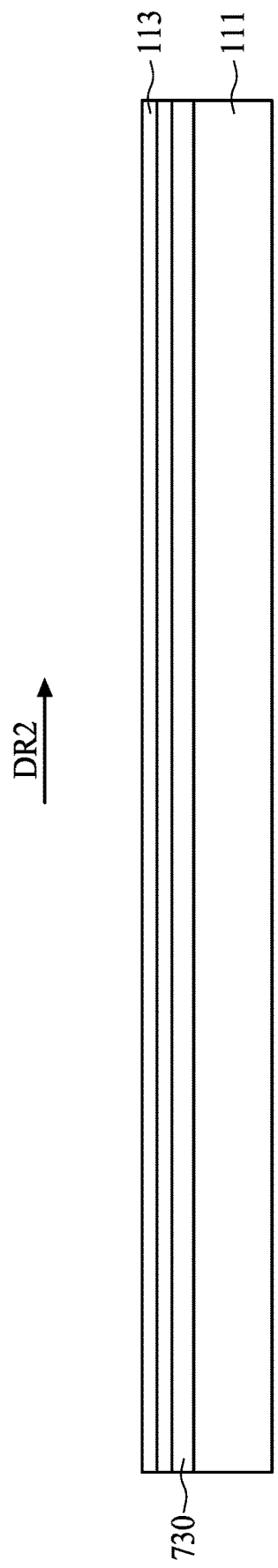
FIGS. 7A and 7B illustrate several operations in manufacturing a semiconductor device according to some embodiments of the present disclosure.
Figure 7B:
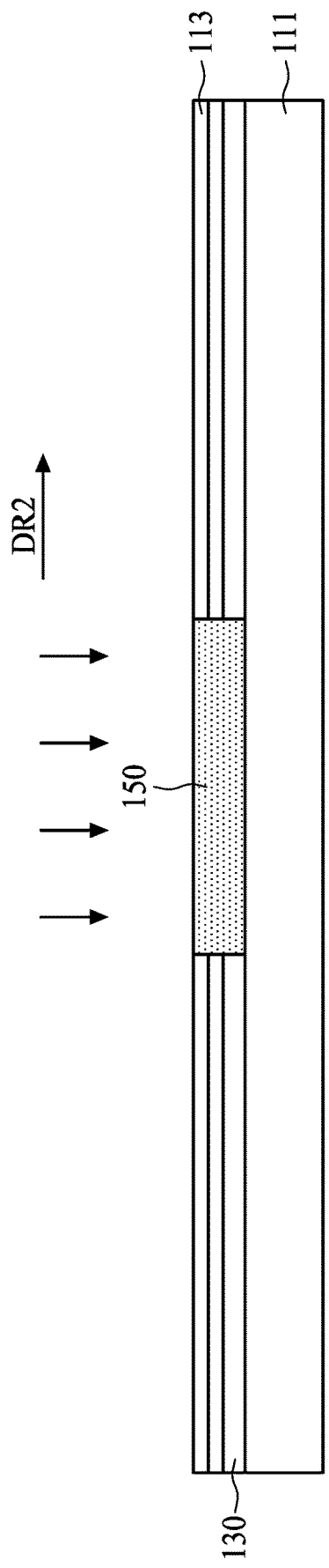

FIGS. 7A and 7B illustrate several operations in manufacturing a semiconductor device according to some embodiments of the present disclosure. Although FIGS. 7A and 7B depict several operations for fabricating the semiconductor device 10I, similar operations can also be used to fabricate the semiconductor device 10, 10A, 10B, 10C, 10D, 10E, 10F, 10G, 10H, 10J, 10K, 10L, 10M, 10N, 10P, 1 or 2.

Referring to FIG. 7A, a III-nitride layer 111 is formed on a substrate (not shown in drawings), and a III-nitride layer 113 is formed on and in direct contact with the III-nitride layer 113. In some embodiments, the III-nitride layers 111 and 113 are formed by epitaxial growth. As a heterojunction is formed between the III-nitride layer 111 and the III-nitride layer 113, e.g., at an interface of the III-nitride layer 111 and the III-nitride layer 113, a 2DEG layer 730 is formed adjacent to the interface of the III-nitride layer 111 and the III-nitride layer 113.

Referring to FIG. 7B, a structure 150 is formed adjacent to the interface of the III-nitride layer 111 and the III-nitride layer 113. In some embodiments, the structure 150 is formed by, for example, performing an implantation process on at least a portion of the III-nitride layer 113, so as to form the structure 150 in the III-nitride layer 113. In some embodiments, the structure 150 is formed by, for example, performing an implantation process on a portion of the III-nitride layer 111 and a portion of the III-nitride layer 113, so as to form the structure 150 in the III-nitride layers 111 and 113.

Next, referring to FIG. 4C, contact layers 121 and 123 are formed over the III-nitride layer 113. In some embodiments, the contact layer 121 and 123 may be formed prior to or after forming the structure 150.

Next, still referring to FIG. 4C, a gate layer 140 is formed between the contact layer 121 and the contact layer 123 from a top view perspective. In some embodiments, the contact layers 121 and 123 and the gate layer 140 can be formed by physical vapor deposition (PVD), chemical vapor deposition (CVD), atomic layer deposition (ALD), plating, and/or other suitable deposition steps.

Next, still referring to FIG. 4C, a field plate 160 is then formed between the contact layer 121 and the contact layer 123. The field plate 160 may be formed by, for example, depositing a conductive material and then patterning the conductive material by etching. Then, conductive vias 122 and 124 are formed over the contact layers 121 and 123, metal layers 221 and 223 are formed over the conductive vias 122 and 124, conductive vias 222 are formed over the metal layer 221, and a metal layer 321 is formed over the contact vias 222. In some embodiments, one or more dielectric layers are formed between the metal layers 221, 223 and 321 and conductive vias 122, 222, and 124. The metal layers 221, 223 and 321 may be independently formed by, for example, depositing a conductive material and then patterning the conductive material by etching. The conductive vias 122, 222, and 124 may be independently formed by, for example, depositing a dielectric material, removing portions of the dielectric material by etching to form through holes, and then filling a conductive material in the through holes.

According to some other embodiments of the present disclosure, referring to FIGS. 7A-7B, the structure 150 may be formed in-situ with the formation of the III-nitride layer 113 by defining a predetermined region and applying aluminum sources with different concentrations on the predetermined region and the remaining region in the formation process of the III-nitride layer 113. The predetermined region may have an aluminum concentration that is unsuitable for generating a heterojunction between the III-nitride layer 111 and the III-nitride layer 113, so as to form the structure 150.

FIG. 8 illustrates an operation in manufacturing a semiconductor device 10P according to some embodiments of the present disclosure. Although FIG. 8 depicts several operations for fabricating the semiconductor device 10P, similar operations can also be used to fabricate the semiconductor device 10, 10A, 10B, 10C, 10D, 10E, 10F, 10G, 10H, 10I, 10J, 10K, 10L, 10M, 10N, 1 or 2.

Referring to FIG. 7A, III-nitride layers 111 and 113 with a 2DEG layer 730 between the III-nitride layer 111 and the III-nitride layer 113 are formed.

Referring to FIG. 8, at least a portion of the III-nitride layer 113 is removed to form a recess 710 in the III-nitride layer 113. In some embodiments, a portion of the III-nitride layer 111 and a portion of the III-nitride layer 113 are removed to form the recess 710 in the III-nitride layers 111 and 113.

In some embodiments, the portion of the III-nitride layer 113 is removed by, for example, an etching step, and the etching step may be performed by dry etching, wet etching, or a combination of dry and wet etching. In some embodiments, the portions of the III-nitride layers 111 and 113 are removed by, for example, one or more etching steps, and the etching step(s) may be performed by dry etching, wet etching, or a combination of dry and wet etching. In some embodiments, the portion of the III-nitride layer 113 and the portion of the III-nitride layer 111 may be removed by the same etching step or separate etching steps using different etchants.

Next, referring to FIG. 5D, a doped group III-V material (e.g., p-GaN material) is formed in the recess 710 to form a layer 151, and a dielectric material is formed on the layer 153 to form a dielectric layer 153. In some embodiments, the layer 151 is formed by, for example, physical vapor deposition (PVD), chemical vapor deposition (CVD), atomic layer deposition (ALD), plating, and/or other suitable deposition steps. In some embodiments, the layer 153 is deposited by: CVD, high density plasma (HDP) CVD, spin-on, sputtering, and the like. The surface of the layer 153 may be then treated by chemical-mechanical planarization (CMP).

Next, referring to FIG. 5D, contact layers 121 and 123 are formed over the III-nitride layer 113. In some embodiments, the contact layers 121 and 123 may be formed prior to or after forming the structure 150.

Next, still referring to FIG. 5D, a gate layer 140 is formed over the III-nitride layer 113 and the layer 153 of the structure 150. In some embodiments, the gate layer 140 can be formed by PVD, CVD, ALD, plating, and/or other suitable deposition steps.

According to some other embodiments of the present disclosure, referring to FIG. 8, after the recess 710 is formed, various suitable material may be formed in the recess 710 so as to form the structure 150. In some embodiments, an n-type polysilicon layer is formed in the recess 710 so as to form the structure 150. In some other embodiments, a dielectric material is formed in the recess 710 so as to form the structure 150.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a first III-nitride layer;
a second III-nitride layer in direct contact with the first III-nitride layer;
a 2DEG region formed adjacent to an interface between the first III-nitride layer and the second III-nitride layer;
a first contact layer forming a drain and a second contact layer forming a source disposed over the second III-nitride layer;
a structure adjacent to an interface of the first III-nitride layer and the second III-nitride layer, wherein a material of the structure is different from a material of the first III-nitride layer or a material of the second III-nitride layer such that a non-active region is formed by the structure;
a gate layer disposed between the first contact layer and the second contact layer;
wherein the structure is positioned adjacent to the 2DEG region between the gate layer and the first contact layer and shapes the 2DEG region such that a width of the 2DEG region between the first contact layer and the gate layer gradually increases from the gate layer to the first contact layer forming the drain; and
wherein the structure is under the gate layer, the first contact layer, or both.

2. The semiconductor device according to claim 1, wherein the structure extends from the gate layer to the second contact layer such that a width of the 2DEG region gradually decreases from the second contact layer to the gate layer.

3. The semiconductor device according to claim 1, wherein the structure has a width along a first direction within a cell of the semiconductor device, and the width of the structure is smaller than a width of the gate layer along the first direction.

4. The semiconductor device according to claim 1, wherein the width of the 2DEG region gradually increases from the first contact layer to the gate layer.

5. The semiconductor device according to claim 1, wherein the structure comprises a doped nitride semiconductor material with a dopant comprising $He^+$, $N^+$, $O^+$, $Fe^+$, $Ar^+$, $Kr^+$, or a combination thereof, a doped group III-V layer, an n-type polysilicon layer, a dielectric material, or a combination thereof.

6. The semiconductor device according to claim 1, further comprising a second structure positioned in the 2DEG region between the gate layer and the first contact layer and shaping the 2DEG region.

7. The semiconductor device according to claim 1 wherein the 2DEG layer comprises a first portion directly contacting the structure, the first portion has a width along a first direction, and the width of the first portion of the 2DEG layer is smaller than a width of the gate layer along the first direction.

8. The semiconductor device according to claim 7, wherein the structure has a width along the first direction within a cell of the semiconductor device, and the width of the structure is smaller than the width of the first portion of the 2DEG layer.

9. The semiconductor device according to claim 8, wherein a ratio of the width of the first portion of the 2DEG layer to the width of the structure is about 2 to about 20.

10. The semiconductor device according to claim 7, wherein the 2DEG layer further comprises a second portion connected to the first portion, the second portion has a width along the first direction, and the width of the second portion is substantially equal to the width of the gate layer.

11. The semiconductor device according to claim 10, wherein the second portion of the 2DEG layer is under the gate layer or the first contact layer.

12. The semiconductor device according to claim 1, further comprising a field plate disposed between the first contact layer and the gate layer from a top view perspective, wherein the structure is under the field plate.

13. A semiconductor device, comprising:
a first III-nitride layer;
a second III-nitride layer in direct contact with the first III-nitride layer;

a 2DEG region formed adjacent to an interface between the first III-nitride layer and the second III-nitride layer;

a first contact layer and a second contact layer disposed over the second III-nitride layer;

a plurality of one or more structures between the first contact layer and the second contact layer from a top view perspective, wherein a material of the structures is different from a material of the first III-nitride layer or a material of the second III-nitride layer; and a gate layer disposed between the first contact layer and the second contact layer wherein the one or more structures is positioned in contact with the 2DEG region between the gate layer and the first contact layer, shaping the 2DEG region such that a width of the 2DEG region between the first contact layer and the gate layer gradually increases from the gate layer towards a point between the gate layer and the first contact layer forming the drain in a first portion and then gradually decreases in a second portion towards the first contact forming the drain.

14. The semiconductor device according to claim 13, wherein the semiconductor device comprises a plurality of cells arranged substantially parallel to the gate layer, and the one or more structures are located between the cells.

15. The semiconductor device according to claim 13, wherein the 2DEG layer comprises a plurality of 2DEG regions, and the structures and the 2DEG regions are interlaced arranged along a first direction that is in substantially parallel to the gate layer.

16. The semiconductor device according to claim 13, wherein each of the structures comprises a doped nitride semiconductor material with a dopant comprising $He^+$, $N^+$, $O^+$, $Fe^+$, $Ar^+$, $Kr^+$, or a combination thereof, a doped group III-V layer, an n-type polysilicon layer, a dielectric material, or a combination thereof.

17. A semiconductor device, comprising:

a first III-nitride layer;

a second III-nitride layer in direct contact with the first III-nitride layer;

a 2DEG region formed adjacent to an interface between the first III-nitride layer and the second III-nitride layer;

a first contact layer forming a drain and a second contact layer forming a source disposed over the second III-nitride layer;

a structure adjacent to an interface of the first III-nitride layer and the second III-nitride layer, wherein a material of the structure is different from a material of the first III-nitride layer or a material of the second III-nitride layer such that a non-active region is formed by the structure;

a gate layer disposed between the first contact layer and the second contact layer;

wherein the structure is positioned adjacent to the 2DEG region between the gate layer and the first contact layer and shapes the 2DEG region such that a width of the 2DEG region between the first contact layer and the gate layer gradually increases from the gate layer to the first contact layer forming the drain; and wherein the structure extends from the gate layer to the second contact layer such that a width of the 2DEG region gradually decreases from the second contact layer to the gate layer.

18. A semiconductor device, comprising:

a first III-nitride layer;

a second III-nitride layer in direct contact with the first III-nitride layer;

a 2DEG region formed adjacent to an interface between the first III-nitride layer and the second III-nitride layer;

a first contact layer forming a drain and a second contact layer forming a source disposed over the second III-nitride layer;

a structure adjacent to an interface of the first III-nitride layer and the second III-nitride layer, wherein a material of the structure is different from a material of the first III-nitride layer or a material of the second III-nitride layer such that a non-active region is formed by the structure;

a gate layer disposed between the first contact layer and the second contact layer; wherein the structure is positioned adjacent to the 2DEG region between the gate layer and the first contact layer and shapes the 2DEG region such that a width of the 2DEG region between the first contact layer and the gate layer gradually increases from the gate layer to the first contact layer forming the drain; and wherein the width of the 2DEG region gradually increases from the first contact layer to the gate layer.

* * * * *